United States Patent
Dutta et al.

(10) Patent No.: US 9,418,751 B1
(45) Date of Patent: Aug. 16, 2016

(54) PRE-PROGRAM DETECTION OF THRESHOLD VOLTAGES OF SELECT GATE TRANSISTORS IN A MEMORY DEVICE

(71) Applicant: SanDisk Technologies Inc., Plano, TX (US)

(72) Inventors: Deepanshu Dutta, Fremont, CA (US); Shota Murai, Fujisawa (JP); Hideto Tomiie, Chigasaki (JP); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/808,329

(22) Filed: Jul. 24, 2015

Related U.S. Application Data

(60) Provisional application No. 62/107,067, filed on Jan. 23, 2015.

(51) Int. Cl.
| | |
|---|---|
| *G11C 16/34* | (2006.01) |
| *G11C 16/10* | (2006.01) |
| *G11C 16/26* | (2006.01) |
| *G11C 16/04* | (2006.01) |
| *G11C 11/34* | (2006.01) |

(52) U.S. Cl.
CPC ............ *G11C 16/34* (2013.01); *G11C 16/0483* (2013.01); *G11C 16/10* (2013.01); *G11C 16/26* (2013.01); *G11C 16/349* (2013.01); *G11C 11/34* (2013.01)

(58) Field of Classification Search
CPC ........ G11C 11/34; G11C 16/04; G11C 16/34; G11C 16/349; G11C 16/26; G11C 16/0483; G11C 16/10
See application file for complete search history.

(56) References Cited

U.S. PATENT DOCUMENTS

| | | | |
|---|---|---|---|
| 8,397,024 B2 | 3/2013 | Fasoli et al. | |
| 8,861,282 B2 | 10/2014 | Dutta et al. | |
| 8,867,271 B2 | 10/2014 | Li et al. | |
| 8,929,142 B2 | 1/2015 | Dong et al. | |
| 8,971,119 B2 | 3/2015 | Avila et al. | |
| 2009/0287879 A1* | 11/2009 | Oh | G11C 16/0483 711/103 |
| 2012/0327713 A1 | 12/2012 | Parat et al. | |
| 2013/0088921 A1* | 4/2013 | Nam | G11C 16/0483 365/185.17 |

(Continued)

OTHER PUBLICATIONS

Cai, Yu, et al., "Error Analysis and Retention-Aware Error Management for NAND Flash Memory," Intel Technology Journal, vol. 17, Issue 1, May 2013, 25 pages.

U.S. Appl. No. 14/612,601, filed Feb. 3, 2015 to L. Pang et al., "Adaptive Increase in Control Gate Voltage of a Dummy Memory Cell to Compensate for Inadvertent Programming,".

U.S. Appl. No. 14/612,561, filed Feb. 3, 2015 to L. Pang et al., "Weak Erase of a Dummy Memory Cell to Counteract Inadvertent Programming,".

(Continued)

*Primary Examiner* — Richard Elms
*Assistant Examiner* — Ajay Ojha
(74) *Attorney, Agent, or Firm* — Vierra Magen Marcus LLP

(57) ABSTRACT

A memory device includes memory cells arranged in NAND strings between select gate transistors. A threshold voltage (Vth) distribution of the select gate transistors is evaluated, such as in response to a program, erase or read command involving a block or sub-block of memory cells. For example, a lower tail and an upper tail of the Vth distribution can be evaluated using read voltages. If the Vth is out-of-range, such as due to read disturb, data retention loss or defects in the memory device, the block or sub-block is marked as being bad and previously-programmed data in the block or sub-block can be copied to another location. If the Vth is in range, the command can be executed. Also, a control gate voltage for the select gate transistors can be set based on a Vth metric which is obtained from the evaluation.

20 Claims, 20 Drawing Sheets

(56) References Cited

U.S. PATENT DOCUMENTS

| | | | |
|---|---|---|---|
| 2013/0322174 A1* | 12/2013 | Li | G11C 16/0483 365/185.09 |
| 2013/0336056 A1* | 12/2013 | Maeda | G11C 16/3404 365/185.2 |
| 2014/0198575 A1 | 7/2014 | Dutta et al. | |
| 2014/0293701 A1 | 10/2014 | Dong et al. | |

OTHER PUBLICATIONS

Invitation to Pay Additional Fees and, Where Applicable, Protest Fee dated Feb. 29, 2016, International Application No. PCT/US2015/061669.

International Search Report & The Written Opinion of the International Searching Authority dated May 13, 2016, International Application No. PCT/US2015/061669.

* cited by examiner

Fig. 1B

```
Code in storage device (150)

boot code (151)

control code / set of instructions (160)

instructions for receiving a program command from a host device (161);

instructions for, in response to the program command, evaluating a
threshold voltage distribution of select gate transistors of a plurality of NAND
strings (162);

instructions for determining, based on the evaluating, whether to execute
the program command or to return a program fail status to the host device (163).
```

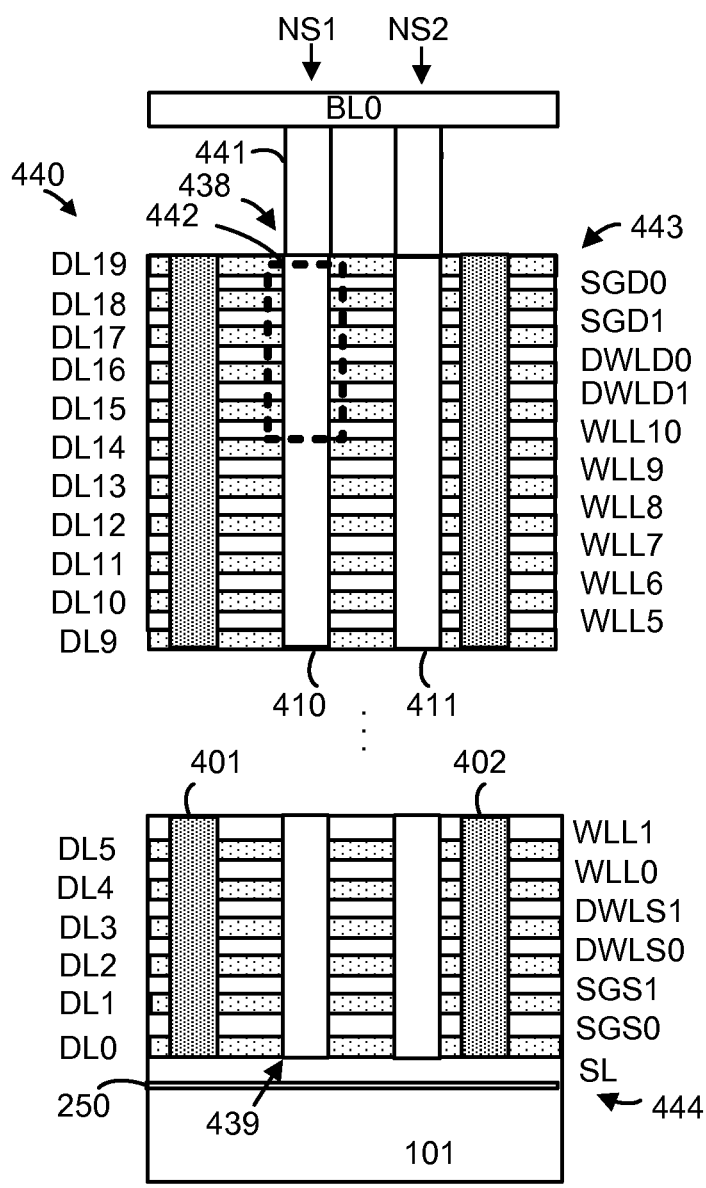

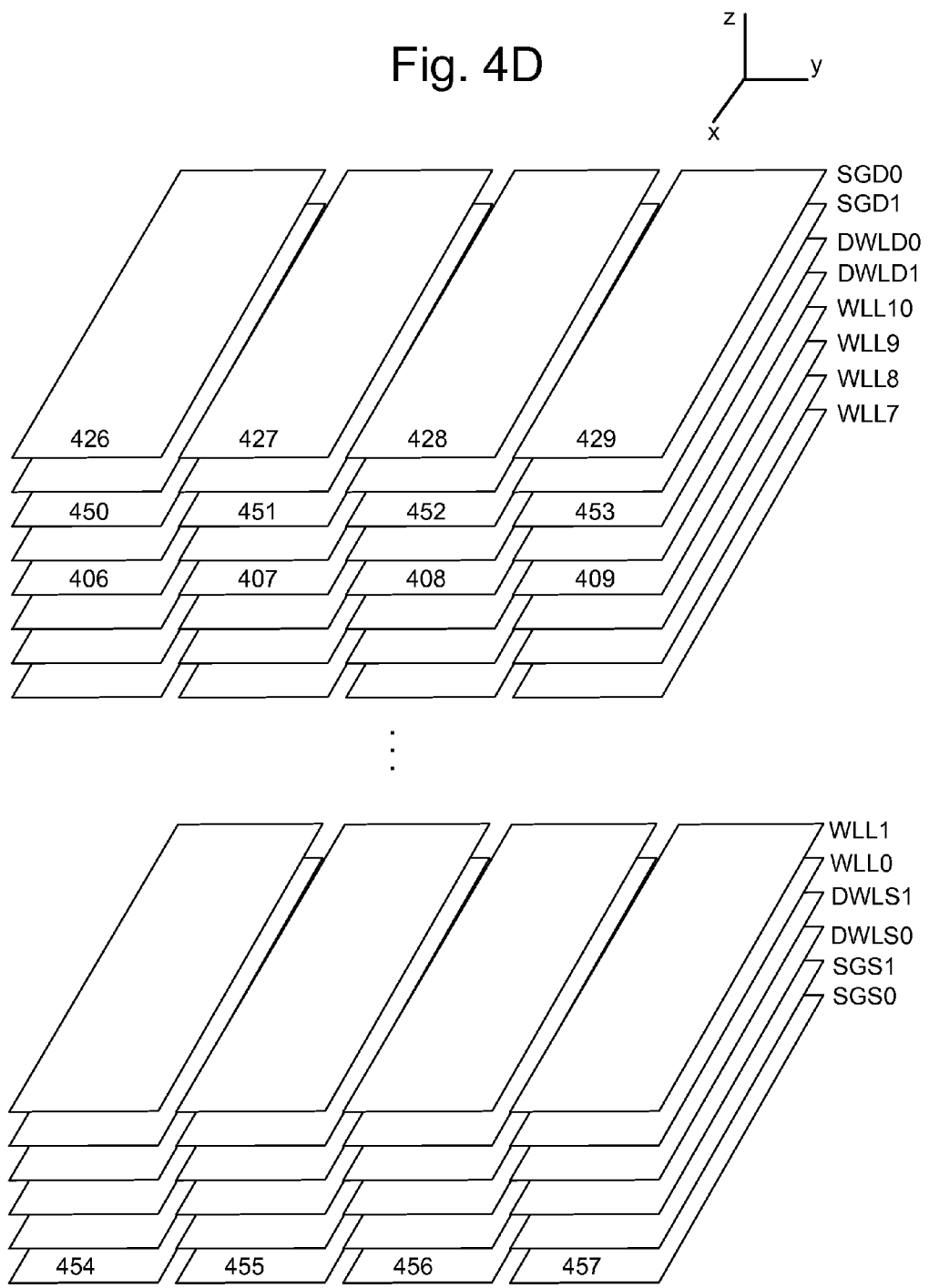

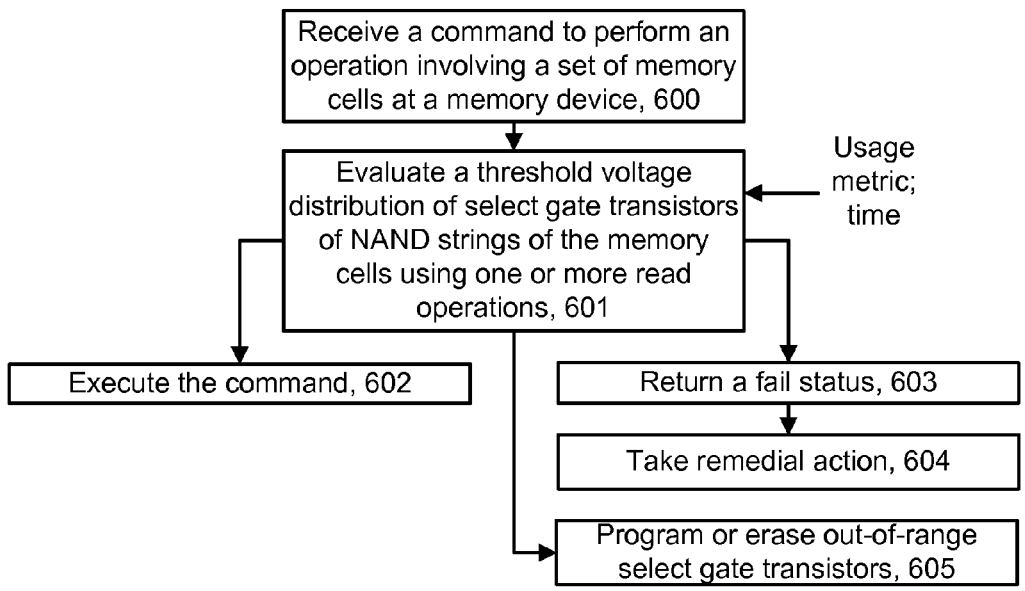
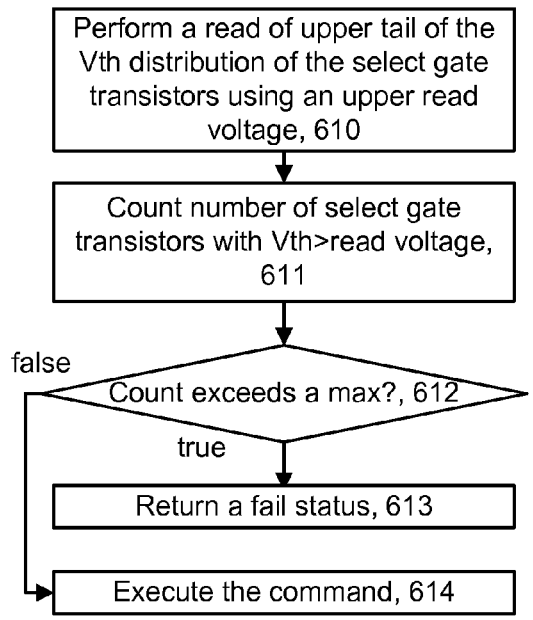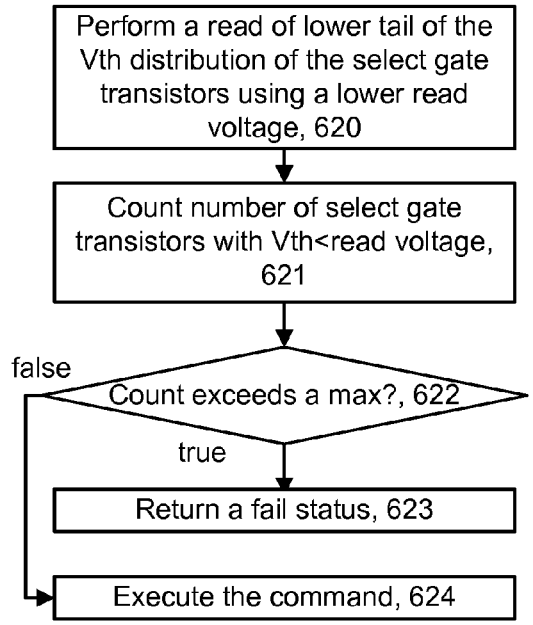
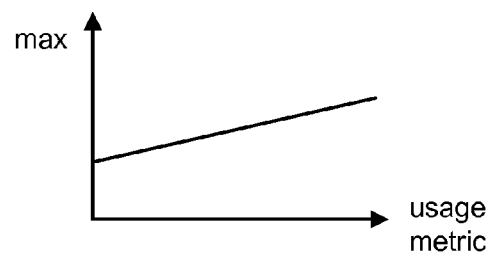

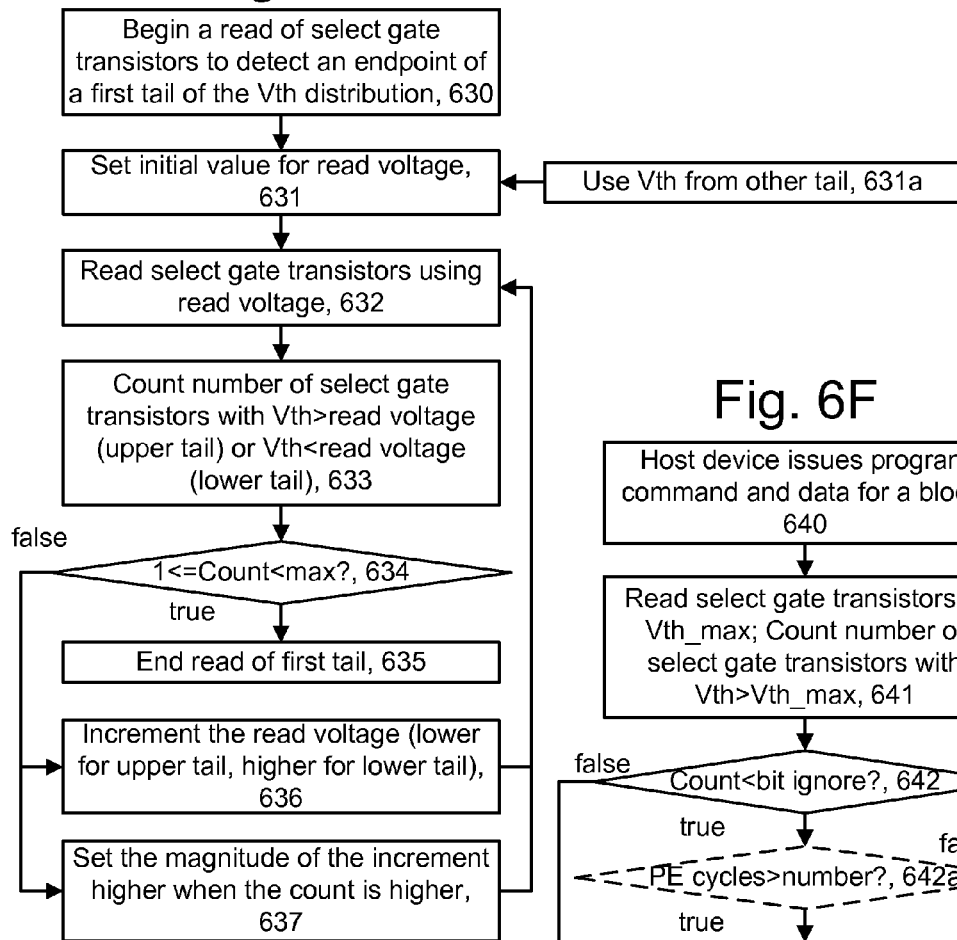

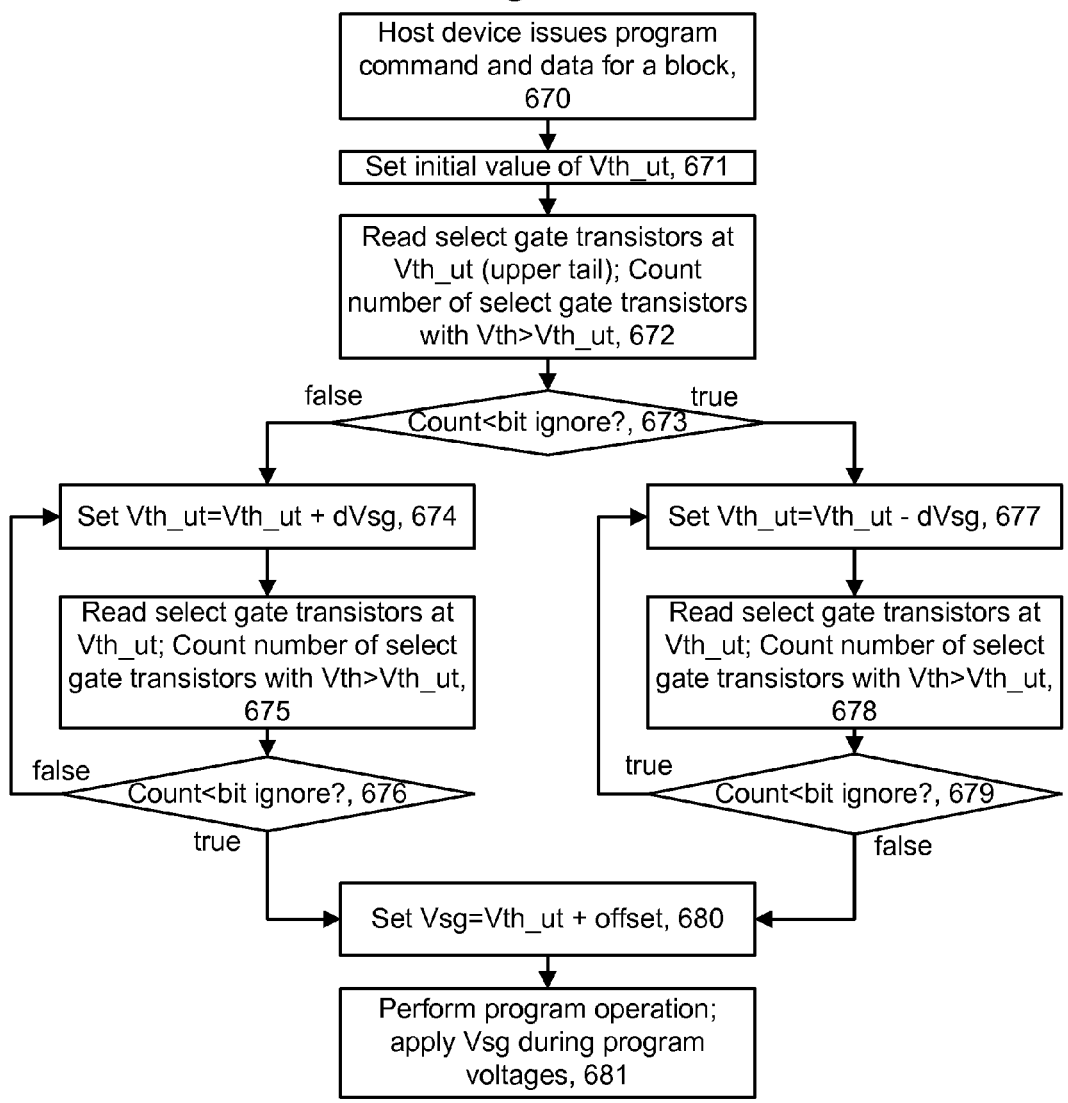

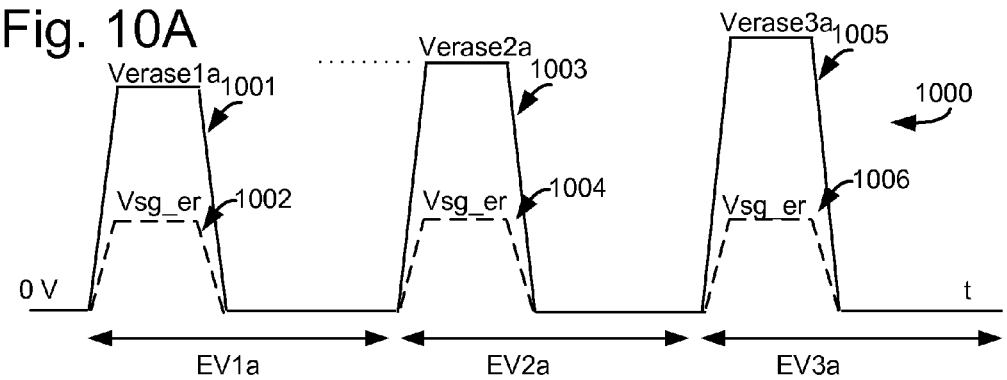
Fig. 10A
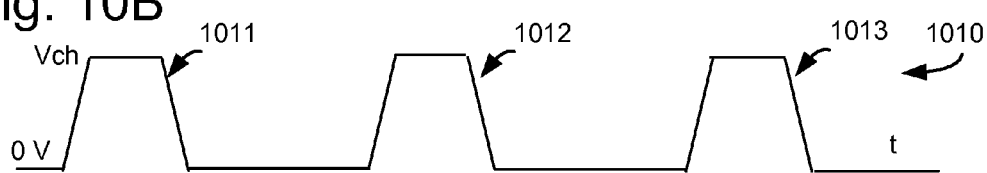
Fig. 10B
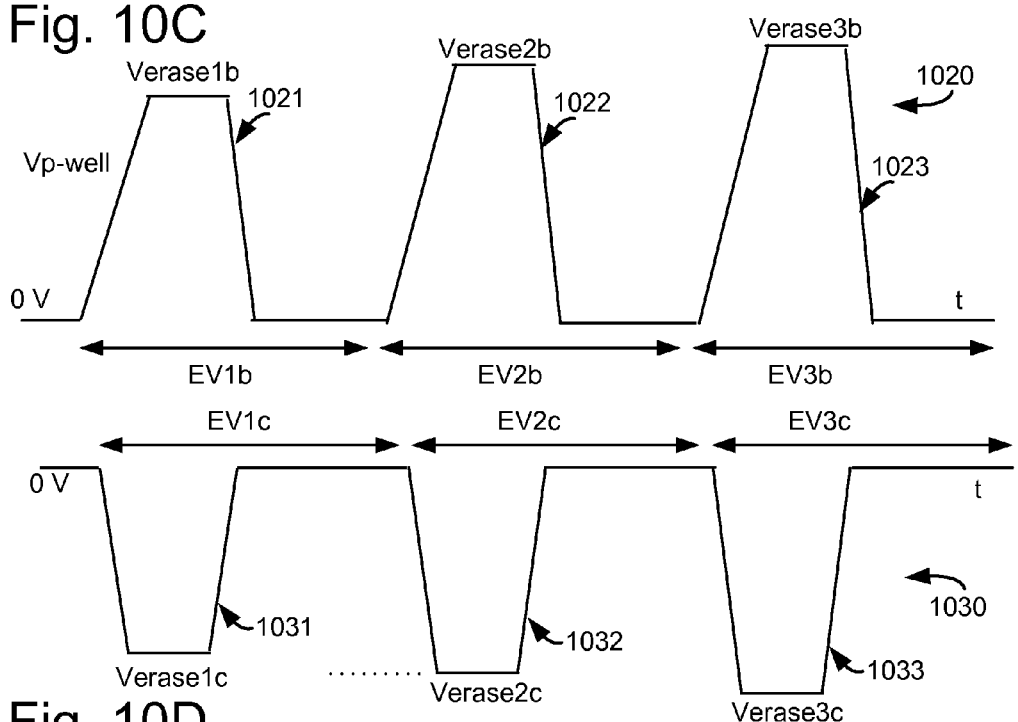
Fig. 10C
Fig. 10D
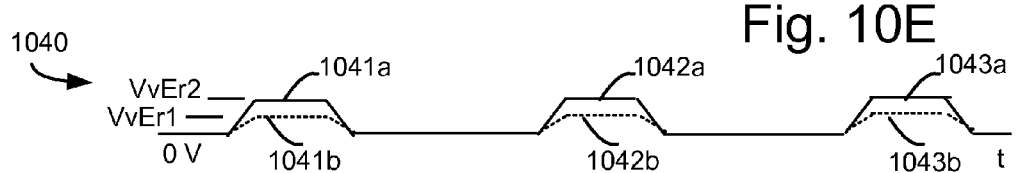
Fig. 10E

PRE-PROGRAM DETECTION OF THRESHOLD VOLTAGES OF SELECT GATE TRANSISTORS IN A MEMORY DEVICE

CROSS-REFERENCE TO RELATED APPLICATIONS

This application claim the benefit of U.S. provisional Patent Application 62/107,067, filed on Jan. 23, 2015 by Dutta et al., titled "Pre-Program Sg Vt Detection For Optimum Sg Operation," and incorporated herein by reference.

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-trapping material can be used in such memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Each memory cell includes the charge-trapping material and may be programmed to store an amount of charge which represents a data state. The memory cells may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1B depicts code which may be executed by the processor 122c of FIG. 1A.

FIG. 4C depicts an embodiment of a stack 440 showing a cross-sectional view along line 412 of FIG. 4A and line 412a of FIG. 4B.

FIG. 4D depicts an alternative view of the select gate layers and word line layers of the stack 440 of FIG. 4C.

FIG. 6A is a flowchart of a process for operating a memory device.

FIG. 6B is a flowchart of an example process for evaluating the Vth distribution of a set of select gate transistors, consistent with step 601 of FIG. 6A, where an upper tail of the Vth distribution is read using a single read voltage.

FIG. 6C is a flowchart of an example process for evaluating the Vth distribution of a set of select gate transistors, consistent with step 601 of FIG. 6A, where a lower tail of the Vth distribution is read using a single read voltage.

FIG. 6D is a plot depicting an increase in the maximum allowable number in decision step 612 of FIG. 6B and step 622 of FIG. 6C as a function of a usage metric of the memory device.

FIG. 6E is a flowchart of an example process for evaluating the Vth distribution of a set of select gate transistors consistent with step 601 of FIG. 6A, where a tail of the Vth distribution is read using multiple read voltages in an iterative process.

FIG. 6F is a flowchart of an example implementation of the process of FIG. 6A, where the operation of step 600 is a programming operation.

FIG. 6H is a flowchart of an example process for evaluating the Vth distribution of a set of select gate transistors consistent with step 601 of FIG. 6A, where an upper tail of the Vth distribution is read using multiple read voltages in an iterative process and, in response, a control gate voltage is set for use during a program voltage of a programming operation.

FIG. 10A depicts example voltages for use when the operation of step 600 is an erase operation, where the erase operation uses gate-induced drain leakage (GIDL) to charge up the channel of a NAND string, such as in a 3D memory device.

FIG. 10B depicts an example channel voltage consistent with FIG. 10A.

FIG. 10C depicts example voltages for use when the operation of step 600 is an erase operation, where a positive voltage is applied to a p-well of a substrate in a 2D memory device.

FIG. 10D depicts example voltages for use when the operation of step 600 is an erase operation, where a negative voltage is applied to the word lines in a block.

FIG. 10E depicts example verify voltages in an erase operation consistent with FIG. 10A-10D.

DETAILED DESCRIPTION

Figure 1A:
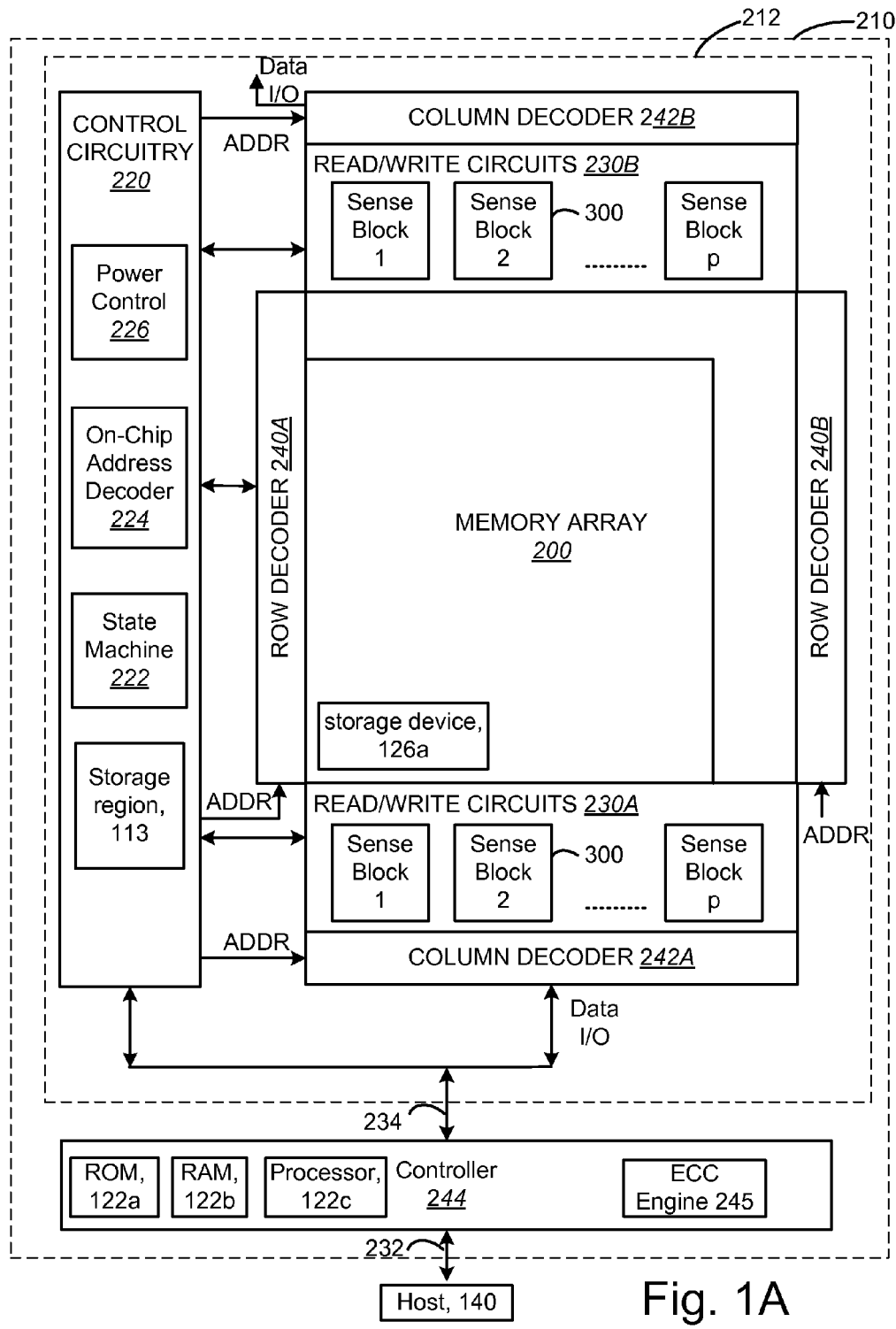
FIG. 1A is a block diagram of a non-volatile memory device.

Techniques provided herein evaluate the threshold voltages of select gate (SG) transistors. A corresponding memory device is also provided.

A NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. The SG transistors can be provided in a conductive state, such as when the NAND string is being sensed in a read or verify operation, or in a non-conductive state, such as when the NAND string is being inhibited from programming and its channel voltage is boosted. The SGD transistors can typically be controlled by a control gate voltage and a bit line voltage, while the SGS transistors can typically be controlled by a control gate voltage and a source line voltage.

Typically, a number of NAND strings are arranged with a common control gate voltage for the SGD transistors of the NAND strings, and another common control gate voltage for the SGS transistors of the NAND strings. To control the SG transistors, their threshold voltages (Vth) should be in an expected range. However, the threshold voltages can change for various reasons. For example, read disturb stress can cause the Vth to increase. Read disturb stress can be experienced by a transistor which has a large voltage difference between its control gate and channel. For instance, during the read of a memory cell in a NAND string, the unselected memory cells and the SG transistors receive a high pass voltage which can cause read disturb. Due to the high control gate-to-channel voltage, charge can be injected into the charge storage region of the SG transistor, gradually programming the SG transistor. On the other hand, read disturb which is experienced by a memory cell is erased when the memory cell undergoes an erase operation.

Data retention loss can cause the Vth to decrease. This occurs when the memory device is powered off for a long period of time, e.g., days, weeks or months. The Vth of the SG transistors can also change due to other factors such as program disturb and defects in the memory device. Some defects are not apparent at the time of manufacture but may appear as the memory device accumulates program-erase cycles and is stressed. One example of a defect is a short circuit. Moreover, the Vth of different SG transistor within a chip can vary even when the memory device is new due to process variations or defects.

The Vth of the SG transistors can change over time in memory devices in which the SG transistors include a charge-storing region which is insulated from the control gate. Examples include a 2D memory device such as flat cell NAND and a 3D memory device such as BiCS. In contrast, in a floating gate memory device, the control gate and the floating gate are shorted together so that the transistors cannot be programmed or erased. Instead, the transistor has a fixed Vth which is set at the time of manufacture, e.g., by the material and doping level.

If Vth of the SG transistors changes substantially, it can result in a shift in the optimum voltages used to operate these transistors, and a corresponding failure in the memory device. These voltages include Vsgd, the control gate voltage of the SGD transistor during a program voltage, Vsgs, the control gate voltage of the SGS transistor during a program voltage, and Vsg, the control gate voltage of the SGD or SGD transistor during read or verify. For example, if the Vth is too high in a SG transistor, the associated NAND string may not be in a fully conductive state during sensing or programming operations. If the Vth is too low in a SG, the associated NAND string may not be in a fully non-conductive state for an unselected NAND string during programming, impairing the ability to boost the channel voltage and prevent program disturb.

In one aspect, techniques provided herein include evaluating the Vth distribution of a set of SG transistors before executing a command such as a program, read or erase command for a block, sub-block or other region of a memory device. The evaluating can include detecting the upper and/or lower tails of the Vth distribution and determining whether they are within an allowable range. If the Vth is outside the allowable range, the block, sub-block or other region can be marked as being bad. Any user data which was previously programmed into the block, sub-block or other region can be copied to another location in the memory device. For example, a state machine or other on-chip controller in the memory device can store a flag indicating that the block, sub-block or other region is ineligible to store data. In one approach, the command, such as a program command, is received from a host device by the memory device, and the memory device returns a program fail status to the host device. In response, the host device may attempt to execute the program command at another location in the memory device.

In another aspect, the operation of the SG transistors is optimized based on the evaluation to avoid a failure in the memory device which affects the end user. For example, the control gate voltage of the SG transistors can be increased or decreased about a nominal initial level when an increase or decrease in the Vth has been detected. The evaluation can provide a Vth metric which is used to set the control gate voltage.

Another aspect involves performing a plurality of read operations to detect a Vth metric which characterizes the upper and/or lower tail of the Vth distribution.

FIG. 1A is a block diagram of a non-volatile memory device. The memory device 210 has read/write circuits for reading and programming a page of memory cells (e.g., NAND multi-state flash memory) in parallel. The system may include one or more memory die 212, also referred to as a chip. The memory die includes a memory structure such as an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory system 210 (e.g., a removable storage card or package) as the one or more memory die. Commands and data are transferred between the host and the controller via lines 232 and between the controller and the one or more memory die via lines 234. Multiple dies may be in communication with one controller. The controller may be outside the memory die, in one approach.

The controller includes an ECC (Error Correction Code) engine 245. In one embodiment, code words are programmed to and read from the memory array 200. The ECC engine is used to create code words for programming and decode code words from reading.

Control circuitry 220 cooperates with the read/write circuits 230A and 230B to perform memory operations on the memory array 200. The control circuitry includes a state machine 222, an on-chip address decoder 224 and a power control module 226. The state machine provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, the state machine 222, decoders 240 A/B and 242A/B, the read/write circuits 230A/B and the controller 244, collectively or separately, can be referred to as one or more managing circuits or one or more control circuits.

A storage region 113 may be provided for parameters for operating the memory device, such as control gate voltages for the SG transistors, and identifying data of a bad block, sub-block or other region of a memory device.

The controller 244 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1B depicts code which may be executed by the processor 122c of FIG. 1A. The code 150 is used by the controller to access the memory structure such as for programming, read and erase operations. The code can include boot code 151 and control code (e.g., a set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions can include, e.g., instructions for receiving a program command from a host device (161), instructions for, in response to the program command, evaluating a Vth distribution of SG transistors of a plurality of NAND strings (162), and instructions for determining, based on the evaluating, whether to execute the program command or to return a program fail status to the host device (163). Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

In one embodiment, state machine 222 may be fully implemented in hardware. In another embodiment, state machine 222 may be implemented in a combination of hardware and software. For example, state machine 222 may include one or more processors and one or more processor readable storage devices that store processor readable code (e.g., software) for programming the one or more processors to perform the methods described herein.

In one embodiment, controller 244 may be fully implemented in hardware. In another embodiment, controller 244 may be implemented in a combination of hardware and software. For example, controller 244 may include one or more processors and one or more processor readable storage devices that store processor readable code (e.g., software) for programming the one or more processors to perform the methods described herein.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
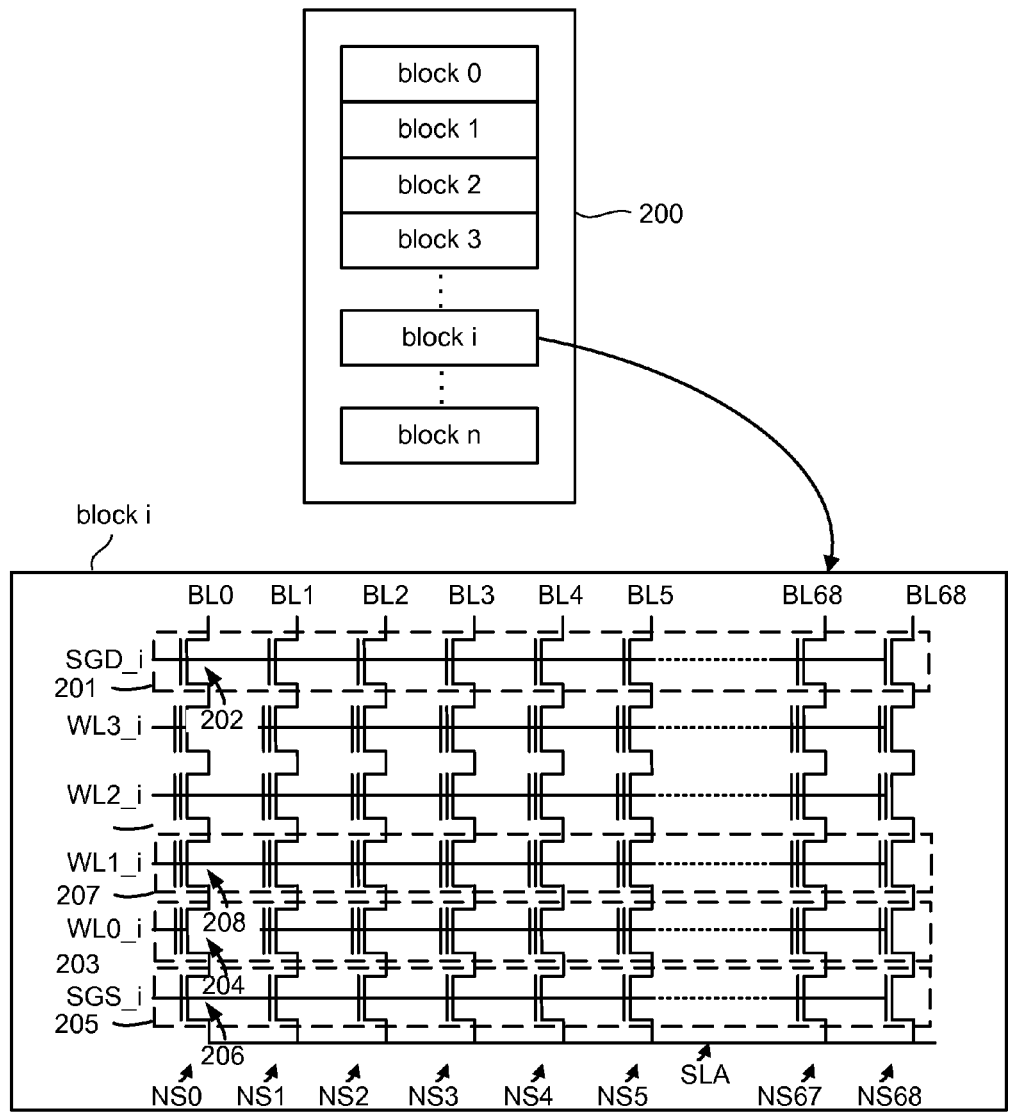
FIG. 2 depicts an example structure of the memory cell array 200 of FIG. 1A.

FIG. 2 depicts an example structure of the memory cell array 200 of FIG. 1A. In one embodiment, the array of memory cells is divided into a large number of sets of memory cells referred to as blocks, where the block is the unit of erase. That is, each block contains the minimum number of memory cells that are erased together. Other embodiments can use different units of erase. In another example, sets of memory cells are sub-blocks such as SB0-SB3 in FIGS. 4A and 14 in a 3D memory device.

As one example, n blocks are provided and an example ith block has 69 NAND strings NS0-NS68 connected to bit lines BL0-BL68, respectively. In one embodiment, all of the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

As a simplified example, four memory cells are connected in series to form a NAND string. The corresponding word lines are WL0_$i$, WL1_$i$, WL2_$i$ and WL3_$i$. One terminal of the NAND string is connected to a corresponding bit line via a drain-side SG (connected to SG drain line SGD_i), and another terminal is connected to the source line via a source-side SG (connected to SG source line SGS_i). A set of SGS transistors 205 includes an example SGS transistor 206, and a set of SGD transistors 201 includes an example SGD transistor 202. Further, WL0_$i$ includes a set of memory cells 203 including an example memory cell 204, and WL1_$i$ includes a set of memory cells 207 including an example memory cell 208.

Each block is typically divided into a number of pages. In one embodiment, a page is a unit of programming. One or more pages of data are typically stored in one row of memory cells. A page can store one or more sectors. A sector includes user data and overhead data. Overhead data typically includes an ECC that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. The memory cells of each word line of a block can typically store one page or an integer number of multiple pages.

Figure 3:
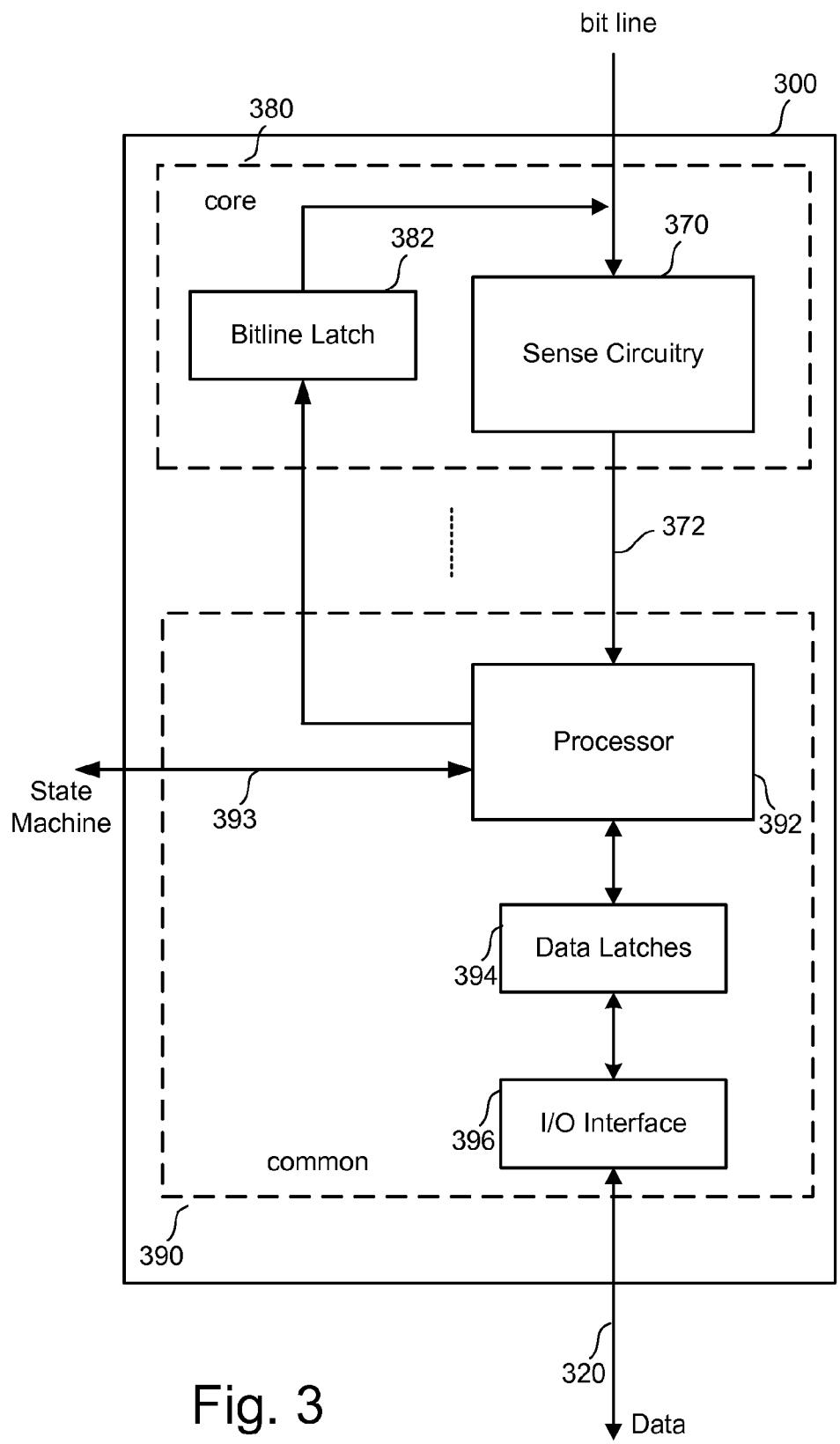
FIG. 3 is a block diagram of the sense block 300 of FIG. 1A.

FIG. 3 is a block diagram of the sense block 300 of FIG. 1A. The sense block includes a core portion, referred to as a sense module 380, and a common portion 390. In one embodiment, there is a separate sense module for each bit line and one common portion for a set of multiple sense modules. In one example, a sense block will include one common portion and eight sense modules. Each of the sense modules in a group will communicate with the associated common portion via a data bus 372.

The sense module comprises sense circuitry 370 that determines whether a conduction current in a connected bit line is above or below a predetermined level. In some embodiments, sense module includes a circuit commonly referred to as a sense amplifier. Sense module includes a bit line latch 382 that is used to set a voltage condition on the connected bit line. For example, a predetermined state latched in bit line latch will result in the connected bit line being pulled to a state designating program inhibit (e.g., Vdd).

Common portion comprises a processor 392, a set of data latches 394 and an I/O Interface 396 coupled between the set of data latches and data bus 320. The processor performs computations such as determining the data stored in the sensed memory cell and storing the data in the set of data latches in a read operation. It is also used to store data bits imported from the data bus during a program operation. The imported data bits represent write data meant to be programmed into the memory. I/O interface 396 provides an interface between data latches and the data bus.

During read or sensing, the operation of the system is under the control of state machine 222 that controls the supply of different control gate voltages to the addressed cell. As it steps through the various predefined control gate voltages (the read reference voltages or the verify reference voltages) corresponding to the various data states supported by the memory, the sense module may trip at one of these voltages and an output will be provided from sense module to processor via the bus. At that point, processor determines the data state by consideration of the tripping event(s) of the sense module and the information about the applied control gate voltage from the state machine via input lines 393. It then computes a binary encoding for the data state and stores the resultant data bits into data latches. In another embodiment of the core portion, bit line latch serves double duty, both as a latch for latching the output of the sense module and also as a bit line latch as described above.

Multiple processors can be provided, where each processor includes an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), the state machine knows to terminate the programming process. In embodiments where each processor communicates with eight sense modules, the state machine may (in some embodiments) need to read the wired-OR line eight times, or logic is added to processor to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches from the data bus. The program operation, under the control of the state machine, comprises a series of programming voltage pulses (with increasing magnitudes) concurrently applied to the control gates of the addressed memory cells to that the memory cells are programmed at the same time. Each programming voltage is followed by a verify process to determine if the memory cell has been programmed to the desired state. The processor monitors the verified data state relative to the desired data state. When the two agree, the processor sets the bit line latch so as to cause the bit line to be pulled to a state designating program inhibit. This inhibits the memory cell coupled to the bit line from further programming even if it is subjected to programming voltages on its control gate. In other embodiments, the processor initially loads the bit line latch and the sense circuitry sets it to an inhibit value during the verify process.

The data latches 394 contain a stack of data latches corresponding to the sense module. In some implementations, the data latches are implemented as a shift register so that the parallel data stored therein is converted to serial data for data bus, and vice versa. In one embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 4A:
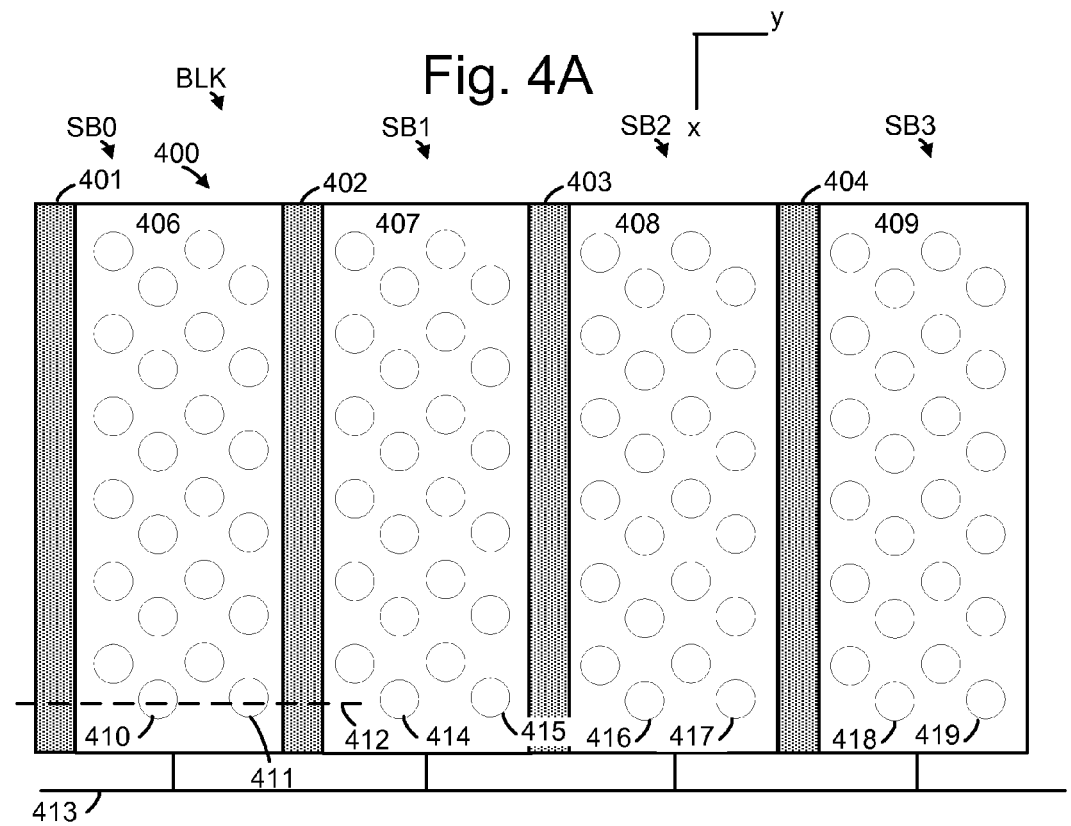
FIG. 4A depicts a top view of an example word line layer 400 of a 3D memory structure, in a straight NAND string embodiment.

FIG. 4A depicts a top view of an example word line layer 400 of a 3D memory structure, in a straight NAND string embodiment. A 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412. See also FIGS. 4C and 14. The region 407 has example memory holes 414 and 415. The region 408 has example memory holes 416 and 417. The region 409 has example memory holes 418 and 419.

Each circle represents the cross-section of a memory hole at a word line layer or SG layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

Figure 14:
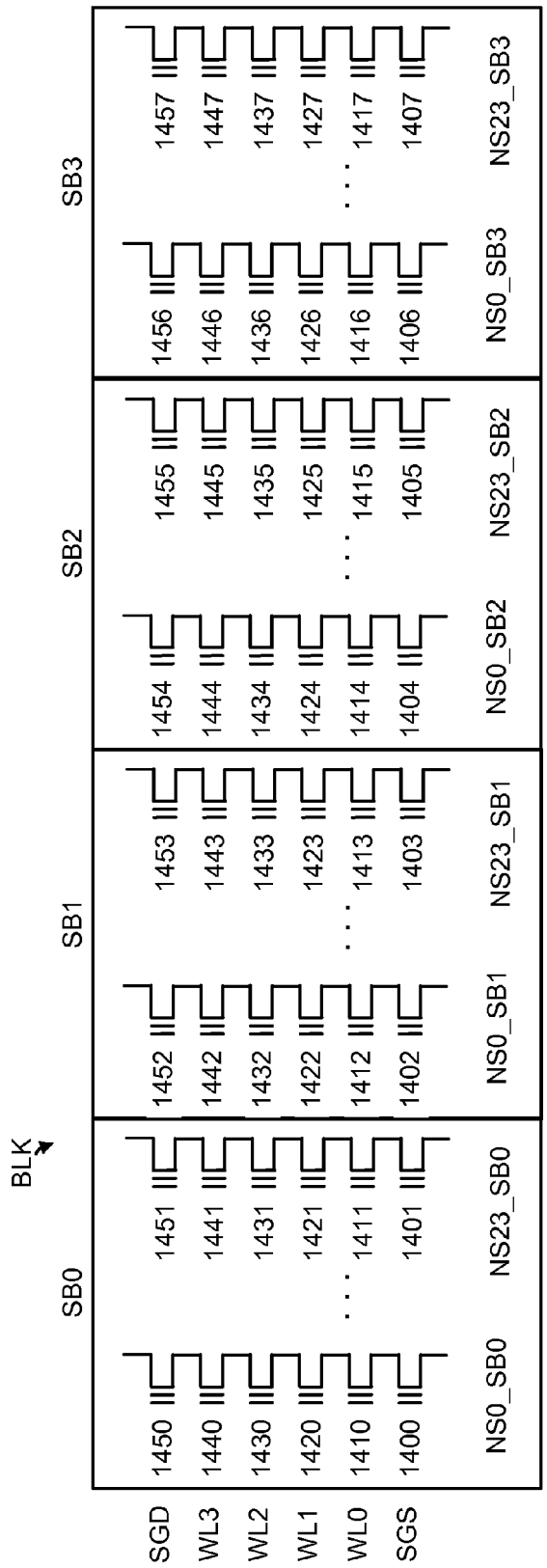
FIG. 14 depicts example NAND strings in the sub-blocks SB0-SB3 of FIG. 4A.

See also FIG. 14 for further details of the sub-blocks SB0-SB3 of FIG. 4A

Figure 4B:
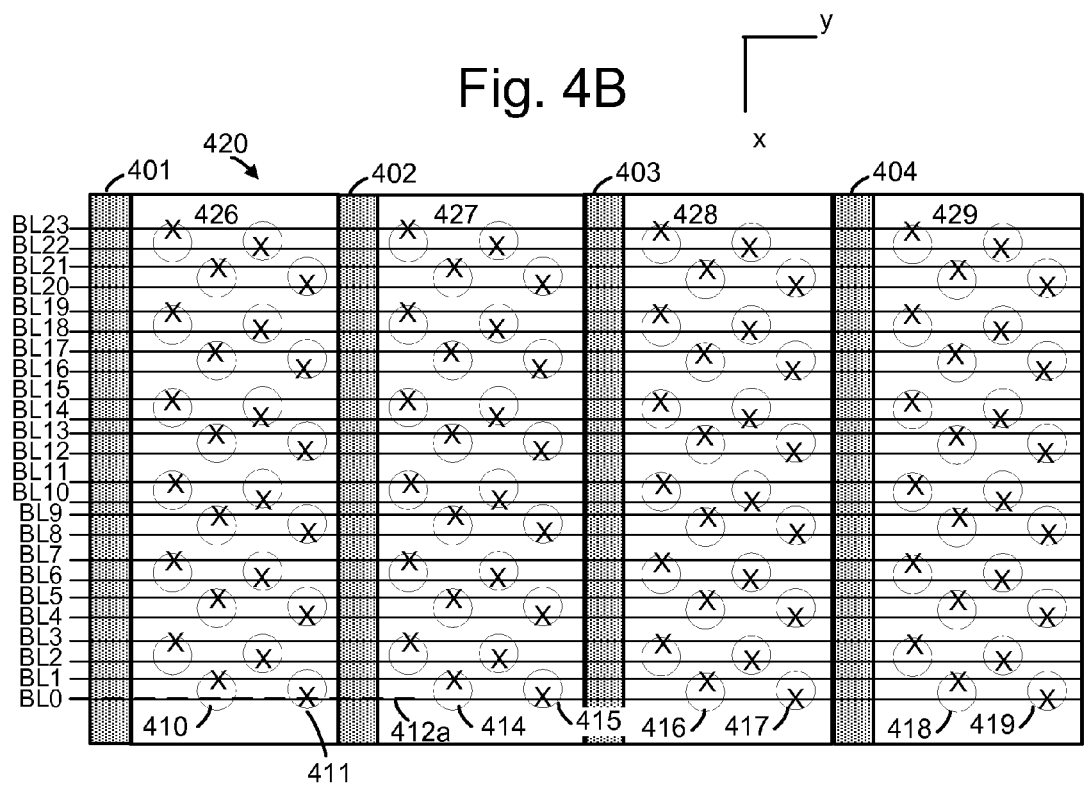
FIG. 4B depicts a top view of an example SGD layer 420, consistent with FIG. 4A.

FIG. 4B depicts a top view of an example SGD layer 420, consistent with FIG. 4A. The SGD layer is divided into regions 426, 427, 428 and 429. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412a which is coincident with a bit line BL0. See also FIG. 4C. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 4C depicts an embodiment of a stack 440 showing a cross-sectional view along line 412 of FIG. 4A and line 412a of FIG. 4B. Two SGD layers, two SGS layers and four dummy word line layers DWLD0, DWLD1, DWLS0 and DWLS1 are provided, in addition to the data word line layers WLL0-WLL10. Columns of memory cells corresponding to NAND strings NS1 and NS2 are depicted in the multi-layer stack. The stack includes a substrate 101, an insulating film 250 on the substrate, and a portion of a source line SL. NS1 has a source-end 439 at a bottom 444 of the stack and a drain-end 438 at a top 443 of the stack. The metal-filled slits 401 and 402 from FIGS. 4A and 4B are also depicted. A portion of the bit line BL0 is also depicted. A conductive via 441 connects the drain-end 438 to BL0. A region 442 of the stack is shown in greater detail in FIG. 4E.

FIG. 4D depicts an alternative view of the SG layers and word line layers of the stack 440 of FIG. 4C. The SGD layers SGD0 and SGD0 (the drain-side SG layers) each includes parallel rows of SG lines associated with the drain-side of a set of NAND strings. For example, SGD0 includes drain-side SG regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 454, 455, 456 and 457. Each SG line can be independently controlled, in one approach. Or, the SG lines can be connected and commonly controlled.

Figure 4E:
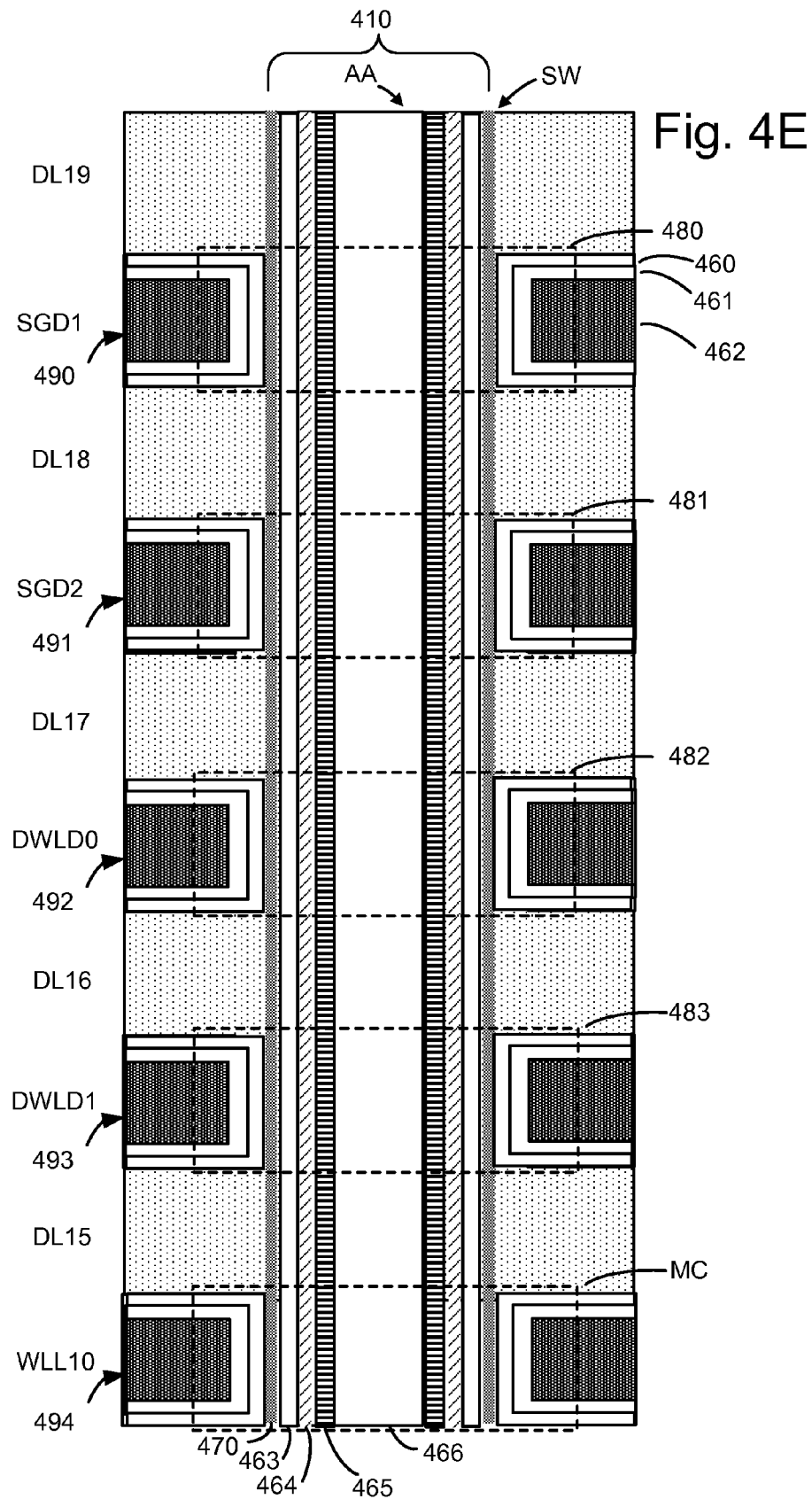
FIG. 4E depicts a view of the region 442 of FIG. 4C.

FIG. 4E depicts a view of the region 442 of FIG. 4C. SGD transistors 480 and 481 are provided above dummy memory cells 482 and 483 and a data memory cell MC. A number of layers can be deposited along the sidewall (SW) of the memory hole 410 and/or within each word line layer, e.g., using atomic layer deposition. For example, each column (e.g., the pillar which is formed by the materials within a memory hole) can include a charge-trapping layer or film 463 such as SiN or other nitride, a tunneling layer 464, a polysilicon body or channel 465, and a dielectric core 466. A word line layer can include a blocking oxide/block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

The NAND string can be considered to have a floating body channel because the length of the channel is not formed on a substrate. Further, the NAND string is provided by a plurality of word line layers above one another in a stack, and separated from one another by dielectric layers.

Figure 5A:
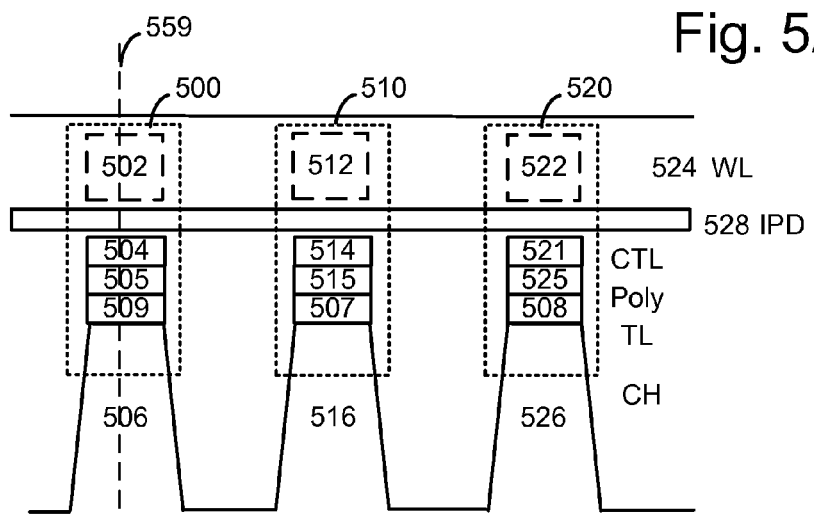
FIG. 5A depicts a cross-sectional view in a word line direction of memory cells comprising a flat control gate and charge-trapping regions as a 2D example of memory cells in the memory cell array 200 of FIG. 1A.

FIG. 5A depicts a cross-sectional view in a word line direction of memory cells comprising a flat control gate and charge-trapping regions as a 2D example of memory cells in the memory cell array 200 of FIG. 1A. This is a flat cell NAND example. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel ling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate is used here instead of a control gate that wraps around a floating gate. One advantage is that the charge-trapping layer can be made thinner than a floating gate. Additionally, the memory cells can be placed closer together.

Figure 5B:
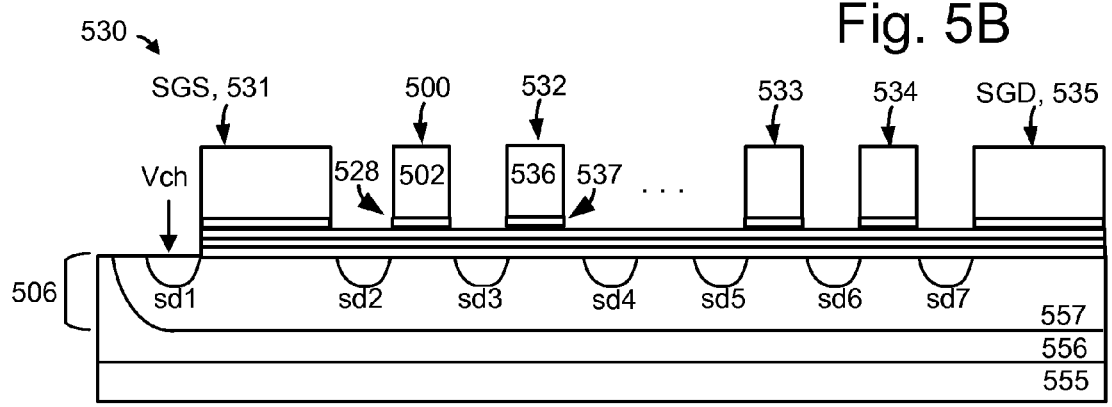
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example memory cells 500, 532, . . . , 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and the IPD layer 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the memory cells but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

One or more dummy memory cells may be provided adjacent to the SG transistors.

FIG. 6A is a flowchart of a process for operating a memory device. Step 600 includes receiving a command to perform an operation involving a set of memory cells at a memory device. For example, the command may be received from a host device at a memory device and may be a program, erase or read command. Typically, the controller of a memory device and a host device communicate using a predetermined protocol. For example, to write data into the memory device, the host device sends a program command followed by an address and the write data, to the controller. The controller in turns, performs the necessary steps to program the write data into the memory cells associated with the address. The write data may be a page of data, and the address may identify a word line layer or a set of cells of the word line layer where the data is to be written. For a read operation, the host device may send a read command followed by an address from which the data is to be read. For an erase operation, the host device may send an erase command followed by an address of cells which are to be erased.

In some cases, a program, read or erase command is generated by the memory device and not received from the host device. For example, the controller may decide to copy data from one set of cells to another, in which case it generates read and program commands. In another example, the controller may generate an erase command to erase a set of cells which contains obsolete data. This erase may be performed to program data to the set of cells, e.g., in response to a program command which is received from the host device or generated internally. Step 601 includes evaluating a threshold voltage distribution of the SG transistors of NAND strings of the memory cells using one or more read operations. For example, these can be the NAND strings in which the memory cells are located. In one example, these are the NAND strings in which the memory cells identified by the address of step 600 are located. The evaluation can result in Vth metrics which characterize the upper and/or lower tails of the Vth distribution.

For example, in FIG. 2, assume the set of memory cells 203 on WL0_*i* have been programmed and the current command is to program the memory cells 207 of WL1_*i*. The evaluation can involve reading the set of SGS transistors 205 and/or the set of SGD transistors 201. Generally, the operation of the SGD transistors is more critical so the evaluation can focus on them exclusively or with a higher priority. In another example, in FIG. 14, assume the set of memory cells 1410-1411 on WL0 in SB0 have been programmed and the current command is to program the memory cells 1420-1421 of SB0.

Optionally, step 601 can be performed in response to some other trigger condition such as a usage metric of the memory device, e.g., a count of read operations or program-erase cycles which is maintained by the controller. Or, the passage of time since a last evaluation can be considered.

The evaluation can involve the upper and/or lower tail of the Vth distribution. Specific examples are provided further below. In response to the evaluation, the command can be executed at step 602, or a fail status can be returned to the host device at step 603. Step 602 is followed if the Vth distribution is within an acceptable range. Step 603 is followed if the Vth distribution is outside the acceptable range, e.g., either at a high end or low end of the range. Step 604 involves taking a remedial action.

A further option, at step 605, is to program or erase out-of-range select gate transistors. For example, one or more select gate transistors with a Vth which is above the acceptable range can be subject to an erase operation which lowers the Vth to within the acceptable range. One or more select gate transistors with a Vth which is below the acceptable range can be subject to a program operation which raises the Vth to within the acceptable range. In one approach, the programming of a select gate transistor involves one or more program-verify iterations until the programming is complete. This can be performed similar to what is shown in FIG. 9B but where a program pulse is followed by a verify voltage of Vsg_pgm_ver such as in FIG. 12A. The erasing of a select gate transistor can involve one or more program-verify iterations until the erasing is complete. This can be performed similar to what is shown in FIGS. 10A and 10C but where an erase pulse is followed by a verify voltage of Vsg_er_ver such as in FIG. 12A.

For example, the waveforms of FIG. 10A can be modified so that Vsg_er is reduced to a level which results in a sufficiently high channel-to-gate voltage during the erase voltage which allows an erase to occur for the select gate transistor. Further, the control gate voltage of the memory cells can float or be set at a level which results in a channel-to-gate voltage which prevents erasing. In the waveform of FIG. 10C, the control gate voltage of the select gate transistor can be set at a level which results in a sufficiently high channel-to-gate voltage which allows an erase to occur for the select gate transistor. Further, the control gate voltage of the memory cells can float or be set at a level which results in a channel-to-gate voltage which prevents erasing.

Regarding the remedial action of step 604, this could include copying data from the NAND strings with the fail status to another set of NAND strings. In the above FIG. 2 example, data could be copied from the set of memory cells 203 on WL0_*i*. In the above FIG. 14 example, data could be copied from the memory cells 1410-1411 on WL0 in SB0.

It is also possible to copy data from other NAND strings which were not evaluated to another set of NAND strings, as a safety measure. For example, a fail status for one sub-block, e.g., in sub-block SB0 in FIG. 4A, can trigger a data recovery in SB0 as well as in the other sub-blocks, SB1, SB2 and/or SB3 in of the block BLK. As a specific example, in FIG. 14, assume that a programming order for the block is: WL0-WL3 in SB0, then WL0-WL3 in SB1, then WL0-WL3 in SB2 and finally WL0-WL3 in SB3. Assume that WL0-WL3 in SB0 and WL0 in SB0 have been programmed. Subsequently, in response to a command to program WL1 in SB1, a fail status is set based on an evaluation of the SGD transistors 1452-1453. In response, the data from WL0-WL3 in SB0 and from WL0 in SB0 is copied to another location.

This another set of NAND strings can be subject to the evaluation of step 601 as well to ensure that the Vth values of the SG transistors are within range. In this case, a method includes receiving first instructions from a host device at a memory device, wherein the first instructions comprise a program command, write data and a first address, and the first address identifies memory cells in one plurality of NAND strings; and in response to the first instructions, evaluating a threshold voltage distribution of SG transistors of the one plurality of NAND strings and determining, based on the evaluating, whether to execute the program command by programming the memory cells corresponding to the first address with the write data, or to return a program fail status to the host device without programming the memory cells corresponding to the first address with the write data. If the program fail status is returned to the host device: the method further includes subsequently receiving second instructions from the host device at the memory device, wherein the second instructions comprise another program command and a second address, the second address identifies memory cells in another plurality of NAND strings and in response to the second instructions: evaluating a Vth distribution of SG transistors of the another plurality of NAND strings; and determining, based on the evaluating of the Vth distribution of the SG transistors of the another plurality of NAND strings, whether to execute the another program command by programming the memory cells corresponding to the second address with the write data, or to return a program fail status to the host device without programming the memory cells corresponding to the second address with the write data.

Additionally, step 604 can include marking the block or sub-block with the out of range SG transistors as being bad, e.g., ineligible to store data. The controller can store status data which provides this data. In future operations, the controller can access this status data if the hosts attempts to provide another program command, for instance, involving the bad block or sub-block. In this approach, the host advantageously need not be modified to keep track of the bad block or sub-block.

Or, instead of marking the block bad, the memory device can erase and re-program the SG transistors to a desired Vth and then execute the command from the host device.

In one scenario, the command is a program command involving memory cells of a selected word line in a block or sub-block, and a number of other words lines in the block or sub-block have been previously programmed according to a word line programming order. When the fail status is set, the previously programmed data can be copied to another block or sub-block, for instance, or even to other memory cells in the same block or sub-block, but in a different set of NAND strings. Note that it is usually possible to recover data in a read operation when the Vth of the SG transistors is out of range because the requirement for the Vth of the SG transistors is more lenient for a read operation than for a programming operation. A read operation can occur successfully as long as the Vth of the SG transistors has not risen so high that the SG transistors cannot be provided in a conductive state when a pass voltage is applied to them. In contrast, the requirement for the Vth of the SG transistors is stricter for a programming operation than for a read operation. In this case, the Vth of the SG transistors has to be high enough that the SG transistor of an unselected NAND string can be provided in a non-conductive state, when a control gate voltage such as 2-3V is applied to it, and a bit line voltage of 2-3 V is applied. The Vth of the SG transistors has to be low enough that the SG transistor of a selected NAND string can be provided in a conductive state, when the same control gate voltage such as 2-3V is applied to it, and a bit line voltage of 0 V is applied.

The controller can also store status data which indicates the block or sub-block is not bad. In this case, status=good. In future operations, the controller can access this status data if the hosts attempts to provide another program command, for instance, involving the same block or sub-block. In this approach, the evaluation of the step 601 can be omitted if it is known that status=good.

For example, consider one plurality of NAND strings which has a status=good for its SG transistors after the evaluating of step 601 in response to a program command (first instructions) involving WL0 in SB0 in FIG. 14. For example, the one plurality of NAND strings can be NS0_SB0-NS23_SB0, the SG transistors can be 1450-1451, and the first address of the program command can identify WL0 in SB0, in FIG. 14. A result of the evaluating (status=good) is saved, where the result indicates the program command is to be executed. Subsequently, second instructions are received from the host device at the memory device, wherein the second instructions comprise a second program command, second write data and a second address, and the second address identifies memory cells in the one plurality of NAND strings. For example, the second address can identify WL1 in SB0, in FIG. 14. In response to the status=good, the memory device executes the second program command by programming the memory cells corresponding to the second address with the second write data without again evaluating the Vth distribution of the SG transistors 1450-1451.

Generally, since the evaluation of the Vth consumes some time, resulting in a performance loss, it is desired to minimize such evaluations as much as possible. Thus, after the evaluation is complete for a block or sub-block, the result of the evaluation can be stored temporarily by the controller and utilized whenever a program operation, or other operation, is performed on that specific block or sub-block.

In one example, a first word line of a block or sub-block is programmed and the evaluation is performed, resulting in status=good. One approach is to omit the evaluation when programming remaining word lines of the block, based on a theory that the Vth distribution has not changed significantly since status=good was set. Another approach is to count the number of read operations since status=good was set, and if this number is above a threshold which indicates that a significant amount of read disturb may have occurred, e.g., 100 or more read operations, the evaluation is performed in response to the next program command. If this number is below the threshold, the evaluation is omitted for the next program command.

Another approach is to count the number of program-erase cycles since status=good was set, and if this number is above a threshold which indicates that a significant amount of read disturb may have occurred, the evaluation is performed in response to the next program command. If this number is below the threshold, the evaluation is omitted for the next program command.

Another example considers the passage of time. This approach tracks the amount of time which has passed since status=good was set, and if this time is above a threshold which indicates that a significant amount of data retention loss may have occurred, e.g., several days, weeks or months, the evaluation is performed in response to the next program command. If this time is below the threshold, the evaluation is omitted for the next program command.

Another example considers that the data retention loss which results in a downshift in the Vth is more likely to occur as the number of program-erase cycles increases. Accordingly, it is possible to omit the evaluation of the lower tail until a specified number of program-erase cycles have occurred. See step 642a in FIG. 6F.

It is possible to store a good or bad status for each sub-block and for an entire block.

Another example for step 601 considers whether a program command involves multiple word lines. For instance, consider the word line programming order in a block. After WL0 is programmed, WL1 will be programmed and so forth. In one approach, a separate command is issued for each word line. However, some systems can cache the user data of multiple word lines. For example, the system may cache the data of multiple word lines, or even a whole block of data, before writing the data to the block. This caching can be done, e.g., in a block other than the block being programmed or in a temporary memory location (e.g., SRAM or DRAM) of a controller. When it is known that a programing operation is a multi-word line programing operation for a set of word lines, the select gate transistors can be evaluated before writing the data to the first word line in the set of word lines. Assuming the select gate transistors pass the evaluation, this approach omits the evaluation of the select gate transistors before writing to each of the remaining word lines in the set of word lines. This is an example of a multi-word line program operation, where the select gate transistors are evaluated at the start of the multi-word line program operation rather than when each word line of the operation is programmed.

Another example for step 601 considers a location of specific SG transistors having a Vth outside a specified range. For example, an out of range SG transistor which is at the edge of a SG layer in a 3D memory device may be more likely to have a short circuit or experience defects and therefore move out of range before other SG transistors. In this case, the location which is considered is a location in a SG layer. A greater weight can be placed on such SG transistors in determining whether to execute the command or return a fail status. For example, a score may be calculated which is a function of the number of out of range SG transistors, where each SG transistor has a weight based on its location and the relative importance of the location. The score is then compared to a pass-fail score to determine whether step 602 or 603 follows step 601.

In another approach, a first score is assigned based on the number of SG transistors having a high Vth (<Vth_min), a second score is assigned based on the number of SG transistors having a high Vth (>Vth_max), and a total score is obtained from the first and second scores. The first and second scores can be added together with equal or different weights. Moreover, a location-based weight can also be included.

Another example for step 601 considers a location of out-of-range SG transistors relative to one another. For example, when a number of adjacent SG transistors are out-of-range, this can indicate a potential defect in the memory device in the area of these SG transistors. Accordingly, the evaluation may assign a higher weight to a number N>1 of adjacent SG transistors which are out-of-range, than to N non-adjacent SG transistors which are out-of-range. In a related method, the evaluating of the Vth distribution can comprise reading the SG transistors to identify a number N>1 of adjacent SG transistor having a Vth outside a specified range, wherein the determining, based on the evaluating, whether to execute the program command assigns a higher weight to the N>1 adjacent SG transistor having a Vth outside the specified range than to N>1 non-adjacent SG transistor having a Vth outside the specified range.

A further option is to track changes in the Vth metrics over multiple evaluations, e.g., by storing corresponding data in the controller. If a sudden increase is seen in the Vth metric of the upper tail or a sudden decrease is seen in the Vth metric of the lower tail, this can indicate that a fail status should be set. A sudden increase can be defined as an increase of more than a specified amount, e.g., in units of voltage.

Changes in the number of out-of-range SG transistors could also be tracked over time. If a sudden increase is seen in this number, this can indicate that a fail status should be set. The tracking could occur separately for the high out-of-range and the low out-of-range SG transistors. A sudden increase can be defined as an increase of more than a specified number of out-of-range SG transistors since a last evaluation.

A further option is to initiate an evaluation of a second set of SG transistors (e.g., in sub-block SB1, SB2 and/or SB3 in FIG. 4A) based on the result from evaluating a first set of SG transistors (e.g., in sub-block SB0 in FIG. 4A). For example, this additional evaluation may be initiated if a fail status is set based on the first set of SG transistors, or if a number of out-of-range SGs in the first set of SG transistors exceeds a specific number. This approach considers that when a potential problem is detected for one set of SG transistors, a similar problem may exist for another set of SG transistors. In one example, referring to FIG. 14, the first set of SG transistors may comprise the SGD transistors 1450-1451 in SB0, and the second set of SG transistors may comprise the SGD transistors 1452-1453 in SB1.

A corresponding method can include, if the program fail status is returned, evaluating a Vth distribution of SG transistors of another plurality of NAND strings, wherein the one plurality of NAND strings and the another plurality of NAND strings are in different sub-blocks of a block. For example, the one plurality of NAND strings can be NS0_SB0-NS23_SB0, the SG transistors can be 1450-1451, and the first address of the program command can identify WL0 in SB0, in FIG. 14. The SG transistors 1452-1453 can be in another plurality of NAND strings NS0_SB1-NS23_SB1 in SB1.

Another corresponding method can include, if the evaluating indicates that more than a specified number of the SG transistors of the one plurality of NAND strings have an out-of-range threshold voltages, evaluating a Vth distribution of SG transistors of another plurality of NAND strings, wherein the one plurality of NAND strings and the another plurality of NAND strings are in different sub-blocks of a block. For example, the one plurality of NAND strings can be NS0_SB0-NS23_SB0 in SB0, the associated SG transistors can be 1450-1451, the another plurality of NAND strings can be NS0_SB1-NS23_SB1 in SB1, and the associated SG transistors can be 1452-1453, A further option for the evaluating of step 601 is to read a subset (e.g., a strict subset, fewer than all) of the SG transistors of the NAND strings. For example, one-half or one-quarter of the SG transistors can be read (e.g., 4K or 8K out of 16K SG transistors). A fast read mode can be used in which a subset of a page is read. Power consumption is reduced because only a subset of the bit lines are pre-charged during the read.

FIG. 6B is a flowchart of an example process for evaluating the Vth distribution of a set of SG transistors, consistent with step 601 of FIG. 6A, where an upper tail of the Vth distribution is read using a single read voltage. Step 610 includes performing a read of the upper tail of the Vth distribution of the SG transistors using an upper read voltage, e.g., Vth_max in FIG. 12B. Step 611 involves counting a number of the SG transistors with Vth>read voltage. These are the SG transistors in a non-conductive state. This is a count of the SG transistors having a Vth beyond, e.g., above, the read voltage.

A decision step 612 determines whether the count exceeds max, a maximum allowable number (a bit ignore number). If decision step 612 is true, a fail status is returned at step 613. If decision step 612 is false, the command is executed at step 614. The maximum allowable number can be one or more. For example, it may be acceptable for a small portion of the SG transistors, e.g., 1-5%, to have a Vth which is out-of-range on the high side. A small number of errors which may result from programming a NAND string with an out-of-range SG transistor can be corrected using ECC decoding.

The maximum allowable number of SG transistors with Vth>read voltage (step 611) and Vth<read voltage (step 621) can be the same, in one approach. This reflects the fact that for SGD transistors, both the upper tail and the lower tail tails are important in determining the Vsgd window. On the other hand, for SGS transistors, controlling the lower tail can be more important than controlling the upper tail since the main concern is to make the SG transistor non-conductive during a program voltage. For a SGS transistor with a low Vth, the transistor may become conductive. Accordingly, one approach is to provide a lower maximum allowable number of SGS transistors with Vth<read voltage compared to the maximum allowable number of SGS transistors with Vth>read voltage for the SGS transistors.

In one approach, Vth_max is predefined and optimized for the memory device. In some cases, the optimal Vth_max can change over time due to a usage of the memory device. Moreover, the maximum allowable number can also change over time due to a usage of the memory device, e.g., as shown in FIG. 6D. Advantageously, with a single upper read voltage, the location of the upper tail of the Vth distribution can be evaluated quickly.

FIG. 6C is a flowchart of an example process for evaluating the Vth distribution of a set of SG transistors consistent with step 601 of FIG. 6A, where a lower tail of the Vth distribution is read using a single read voltage. Step 620 includes performing a read of the lower tail of the Vth distribution of the SG transistors using a lower read voltage, e.g., Vth_min in FIG. 12B. Step 621 involves counting a number of the SG transistors with Vth<read voltage. These are the SG transistors in a conductive state. This is a count of the SG transistors having a Vth beyond, e.g., above, the read voltage.

A decision step 622 determines whether the count exceeds a maximum allowable number (a bit ignore number). If decision step 622 is true, a fail status is returned at step 623. If decision step 622 is false, the command is executed at step 624. The maximum allowable number can be one or more. For example, it may be acceptable for a small portion of the SG transistors, e.g., 1-5% to have a Vth which is out-of-range on the low side. The maximum allowable number can be the same or different for the upper and lower tails.

In one approach, Vth_min is predefined based on a predefined range of allowable Vth values for the SGs. In some cases, the optimal Vth_min can change over time due to a usage of the memory device. Moreover, the maximum allowable number can also change over time due to a usage of the memory device, e.g., as shown in FIG. 6D. Advantageously, with a single lower read voltage, the location of the lower tail of the Vth distribution can be evaluated quickly.

Note that the fail status can be set when the upper and lower tails are out-of-range, or when only one of the upper and lower tails is out-of-range. Further, the evaluation of step 601 can involve checking one or both of the upper and lower tails at different times or with different frequencies. For example, the upper tail may be checked more frequently than the lower tail based on a theory that an upshift in the Vth distribution due to read disturb is more likely than a downshift in the Vth distribution due to data retention loss. As an example, the upper tail may be checked with every program command, while the lower is checked with every other program command.

Or, the upper tail but not the lower tail may be read in the evaluations until a specified number of program-erase cycles have occurred. Subsequently, both the upper and lower tails can be read. See decision step 642a of FIG. 6F.

FIG. 6D is a plot depicting an increase in the maximum allowable number in decision step 612 of FIG. 6B and step 622 of FIG. 6C as a function of a usage metric of the memory device. The maximum allowable number can be adjusted over the life of the memory device such as to allow for cycling degradation effects. For example, near the end of the life, there is a greater likelihood of errors due to wear out of the select gate transistors. However, there may also be a greater tolerance for errors. As a result, a higher maximum allowable number can be used near the end of the lifetime, as compared to when the memory device is fresh. This is an example of increasing the maximum allowable number over a lifetime of the memory device. For example, low-density parity check (LPDC) error-correction code (ECC) engine based systems generally impose a lower allowable bit error rate (BER) in the early lifetime of the memory device, while allowing a larger BER at the end of the lifetime. For such systems, it is reasonable to have a greater tolerance for errors for the select gate transistor at the end of the lifetime. On the other hand, for Bose-Chaudhuri-Hocquenghem (BCH) ECC engines, the tolerance for errors may be the same throughout the lifetime of the chip.

FIG. 6E is a flowchart of an example process for evaluating the Vth distribution of a set of SG transistors consistent with step 601 of FIG. 6A, where a tail of the Vth distribution is read using multiple read voltages in an iterative process. The steps include beginning a read of the SG transistors to detect an endpoint of a first tail of the Vth distribution (step 630). For example, the endpoint could include a highest Vth among the set of SG transistors being evaluated. Step 631 involves setting an initial value for the read voltage. For example, see Vth_ut1 in FIGS. 12C and 12D. The initial value can be fixed or set adaptively. For instance, a Vth from the other tail of the Vth distribution, if available, may be used (step 631a). For example, the initial value for reading the upper tail may be equal to a Vth metric of the lower tail plus an offset, and the initial value for reading the lower tail may be equal to a Vth metric of the upper tail minus an offset. See FIGS. 13B and 13C.

Step 632 involves reading the SG transistors using the current read voltage. Step 633 involves counting a number of SG transistors with Vth>read voltage (in case the first tail is the upper tail) or Vth<read voltage (in case the first tail is the lower tail). A decision step 634 determines whether 1<=Count<max, where max is some maximum allowable number of out-of-range values of the tail of the Vth distribution. If decision step 634 is true, the end of the read of first tail is reached at step 635. If decision step 634 is false, then either step 636 or 637 is performed. Step 636 involves incrementing the read voltage, e.g., lower for the case of reading the upper tail, and higher for the case of reading the lower tail. For example, a fixed increment can be used as in FIG. 12C. Step 637 sets the magnitude of the increment adaptively, e.g., higher when the count is higher, as in FIG. 12D. The increment is positive when reading the upper tail and negative when reading the lower tail. Subsequently, another read is performed at step 632.

The current value of the read voltage at the end of the process is a Vth metric which characterizes the lower or upper tail. This metric can be used to set a control gate voltage for the SG transistors.

FIG. 6F is a flowchart of an example implementation of the process of FIG. 6A, where the operation of step 600 is a programming operation. At step 640, the host device issues a program command and data for a block. The host may also provide a first address of memory cells to which the data is to be written. For example, the address could identify a page of memory cells and/or a word line. For example, in FIG. 2, assume the set of memory cells 203 on WL0_i have been programmed and the current command is to program the memory cells 207 of WL1_i. The first address will therefore identify WL1_i.

Step 641 involves reading the SG transistors at Vth_max, e.g., in an upper tail read, and counting a number of SG transistors with Vth>Vth_max. As an example, assume the reading is for the set of SGD transistors 201 in FIG. 2.

A decision step 642 determines whether the count is less than a bit ignore amount (e.g., a maximum allowed number of above-range SG transistors). If decision step 642 is true, optional decision step 642a is reached. This step involves determining whether a number of program-erase (PE) cycles in the memory device is higher than a specified number, e.g., 1,000 cycles. This step allows the lower tail read to be omitted when the PE count is low and a downshift in the Vth due to data retention loss is less likely to occur. The time consumed by the process is thereby reduced. If decision step 642a is true, step 643 is reached. If decision step 642a is false, step 645 is reached.

Step 643 involves reading the SG transistors at Vth_min, e.g., in a lower tail read, and counting a number of SG transistors with Vth<Vth_min. A decision step 644 determines whether the count is less than a bit ignore amount (e.g., a maximum allowed number of below-range SG transistors). If decision step 644 is true, step 645 is reached. If decision step 644 is false, step 646 is reached.

If decision step 642 is false, step 646 is reached, where a program status=fail is issued by the memory device to the host device. Further, step 647 marks the block as being bad (e.g., block i in FIG. 2), and step 648 involves programming the data, and copying any previously-programmed data in the block or sub-block, to another block or sub-block. As an example, in FIG. 2 the previously-programmed data of the set of memory cells 203 on WL0 may be copied to another block, such as block i+1.

This approach requires both the upper and lower tails to be within a specified range before allowing the programming operation to occur.

This is an example of reading the SG transistors using an upper read voltage; based on the reading, obtaining a first count of the SG transistors having a Vth above the upper read voltage; reading the SG transistors using a lower read voltage; and obtaining a second count of the SG transistors having a Vth below the lower read voltage, wherein a program command is executed when the first count is no more than a respective maximum allowable number and the second count is no more than a respective maximum allowable number. The respective maximum allowable numbers can be the same or different for the lower and upper tails.

Figure 6G:
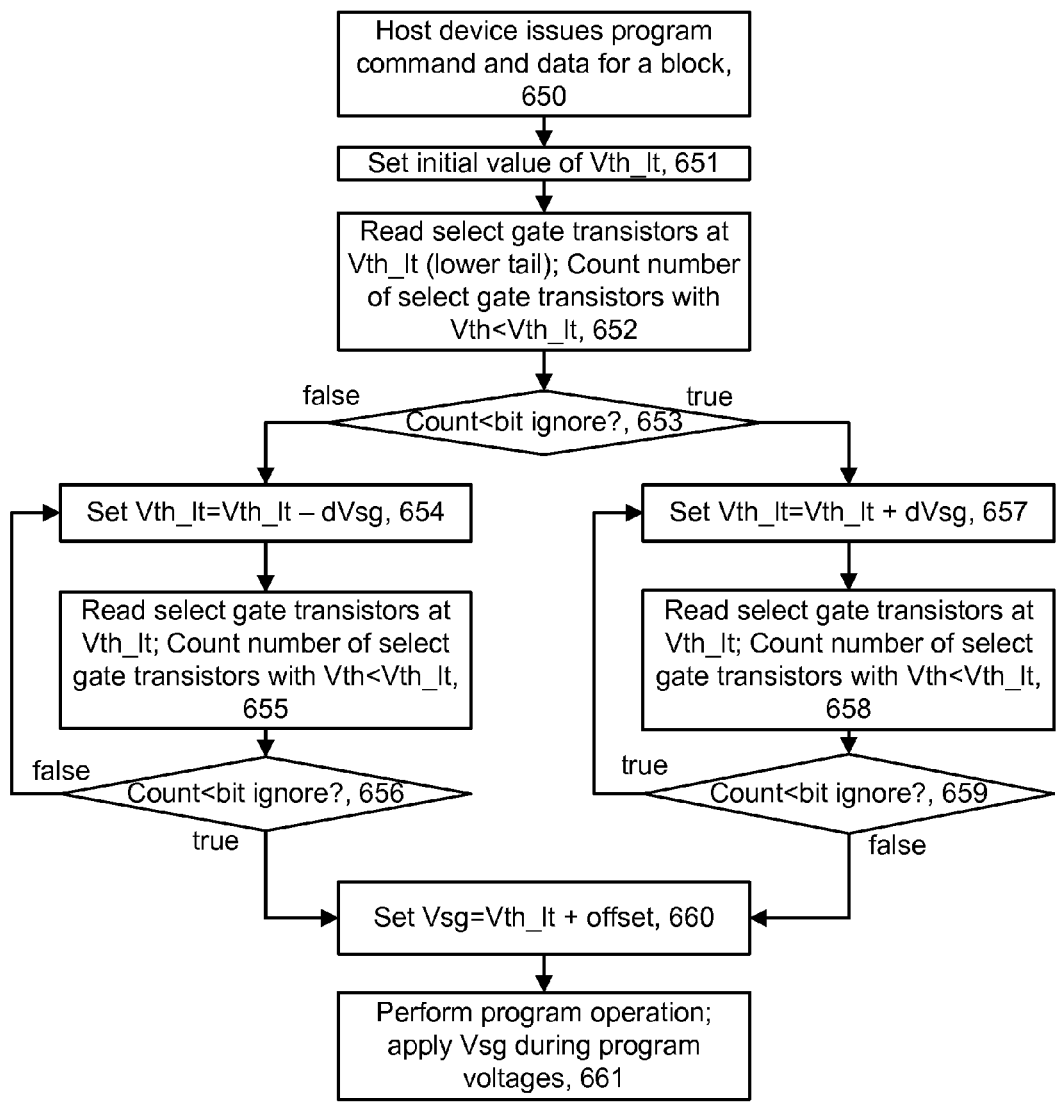
FIG. 6G is a flowchart of an example process for evaluating the Vth distribution of a set of select gate transistors consistent with step 601 of FIG. 6A, where a lower tail of the Vth distribution is read using multiple read voltages in an iterative process and, in response, a control gate voltage is set for use during a program voltage of a programming operation.

FIG. 6G is a flowchart of an example process for evaluating the Vth distribution of a set of SG transistors consistent with step 601 of FIG. 6A, where a lower tail of the Vth distribution is read using multiple read voltages in an iterative process and, in response, a SG control gate voltage is set for use during a program voltage of a programming operation. Thus, the precise position of the Vth lower tail is detected and used to adaptively set a SG control gate voltage for later use. In one approach, FIGS. 6G and 6H can be performed if step 602 of FIG. 6A, step 614 of FIG. 6B or step 624 of FIG. 6C are reached.

This approach provides an iterative way to evaluate the lower tail of the Vth distribution. In some cases, the tail is identified quickly so that relatively few iterations are required. Moreover, the maximum allowable number of read operations can be limited so that excessive time is not spent on reading the SG transistors. For example, a fail status can be set if the number of read operations exceeds a limit.

At step 650, the host device issues a program command and data for a block or sub-block. An initial value of Vth_lt is set at step 651. Step 652 involves reading the SG transistors at Vth_lt, and counting a number of the SG transistors with Vth<Vth_lt. A decision step 653 determines whether the count<bit ignore. Bit ignore is a maximum allowable number of SG transistors which are allowed to be out-of-range on the low side.

If decision step 653 is false, step 654 is followed. Step 654 sets Vth_lt=Vth_lt −dVsg, where dVsg is a positive voltage increment. Step 655 involves reading the SG transistors at Vth_lt, and counting a number of the SG transistors with Vth<Vth_lt. A decision step 656 determines whether the count<bit ignore. If decision step 656 is false, step 654 is repeated. If decision step 656 is true, step 660 is reached. Step 660 involves setting Vsg=Vth_lt+offset_lt, where offset_lt is a positive value which can be optimized for each memory device. Step 661 performs a programming operation which applies Vsg to the SG transistors during the program voltages. Vsg represents Vsgd for the SGD transistor or Vsgs for the SGS transistor.

If decision step 653 is true, step 657 is followed. Step 657 sets Vth_lt=Vth_lt+dVsg. Step 658 involves reading the SG transistors at Vth_lt, and counting a number of the SG transistors with Vth<Vth_lt. A decision step 659 determines whether the count<bit ignore. If decision step 659 is true, step 657 is repeated. If decision step 659 is false, step 660 is reached.

This process determines a specific read voltage which is close to, within a margin of less than +/−dVsg, of a theoretical Vth (e.g., Vth_sp1 in FIG. 12C) below which exactly the bit ignore number of the SG transistors have a lower Vth. If the path of steps 657-659 is followed, the initial Vth_lt is below this specific read voltage and the read voltage is iteratively increased until the read voltage is just above this specific read voltage. If the path of steps 654-656 is followed, the initial Vth_lt is above this specific read voltage and the read voltage is iterative decreased until the read voltage is just below this specific read voltage.

Figure 12A:
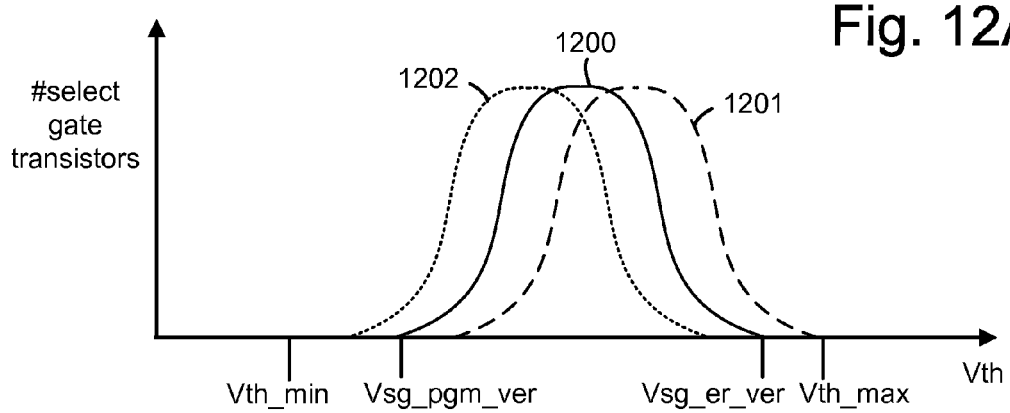
FIG. 12A depicts a plot of a select gate Vth distribution, showing an initial distribution 1200, a distribution after read disturb 1201, and a distribution after data retention loss 1202.
Figure 12B:
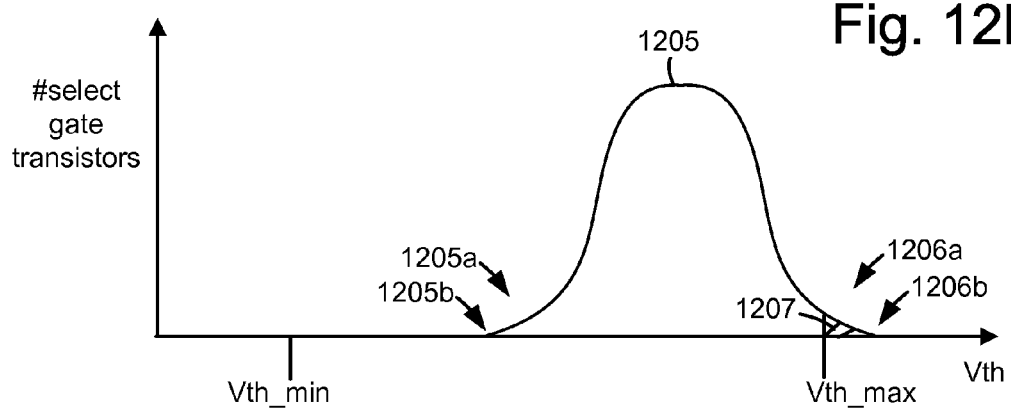
FIG. 12B depicts a plot of a select gate Vth distribution which exceeds a maximum allowable voltage, Vth_max.
Figure 12C:
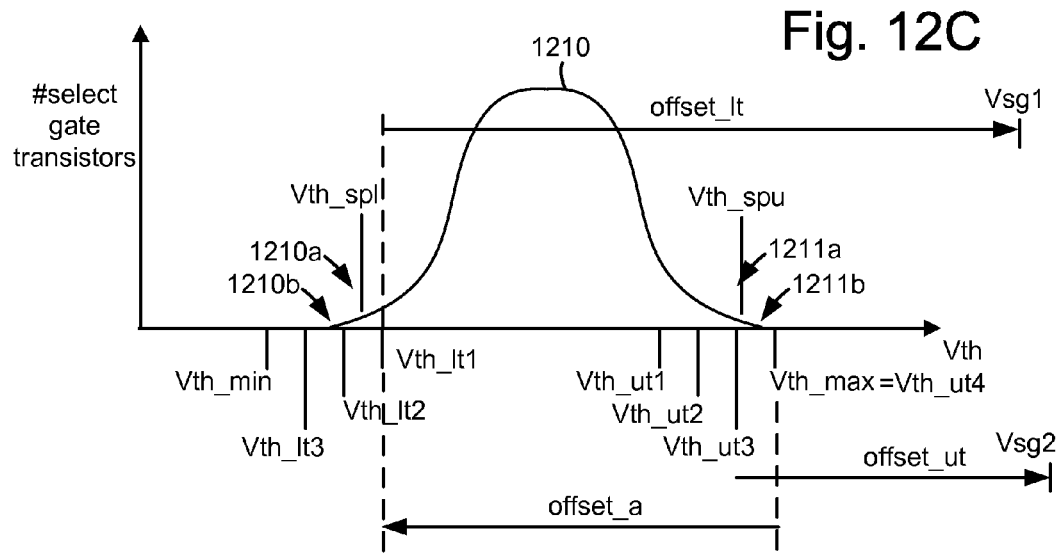
FIG. 12C depicts a plot of a select gate Vth distribution which is read using read voltages consistent with the processes of FIGS. 6G and 6H.

For instance, referring also to FIG. 12C, assume that Vth_lt=Vth_lt1 in step 651. In this case, decision step 653 is false (since Vth_lt1>Vth_sp1). Vth_lt=Vth_lt2 in step 654 (assuming dVsg is the increment between the voltages in FIG. 12C) so that decision step 656 is true (since Vth_lt2<Vth_sp1). In this case, Vth_lt2 is the final value of the read voltage and the Vth metric which represents the lower tail. At step 660, Vsg=Vth_lt2+offset_lt.

Figure 12D:
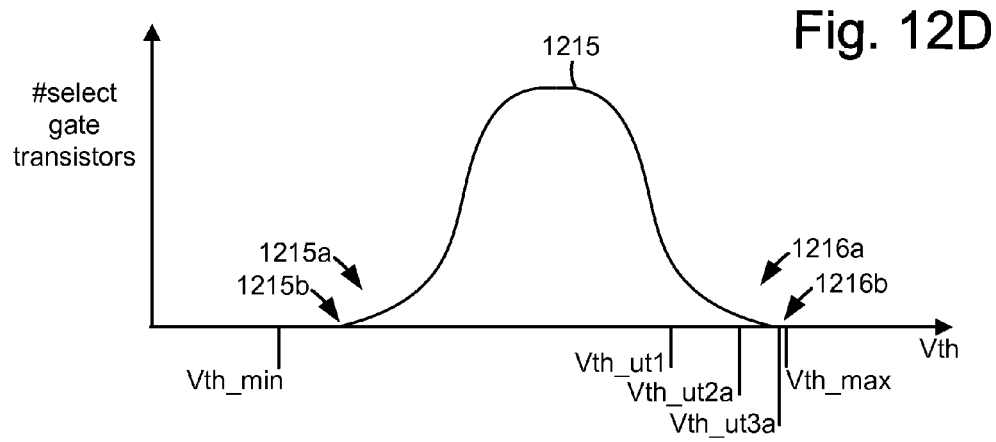
FIG. 12D depicts a plot of a select gate Vth distribution which is read using upper tail read voltages which are adaptively set, consistent with the processes of FIGS. 6G and 6H and with the plot of FIG. 13A.

In another example, referring also to FIG. 12C, assume Vth_lt=Vth_lt3 in step 651. In this case, decision step 653 is true (since Vth_lt3<Vth_sp1). Vth_lt=Vth_lt2 in step 657, and decision step 659 is true (since Vth_lt2<Vth_sp1). Then, Vth_lt=Vth_lt1 in step 657, and decision step 659 is false (since Vth_lt1>Vth_sp1). In this case, Vth_lt1 is the final value of the read voltage and is a Vth metric which represents the lower tail. At step 660, Vsg=Vth_lt1+offset_lt=Vsg1 as depicted in FIG. 12D.

In this example, Vsg is higher by dVsg when the initial read voltage is below Vth_sp1 than when Vsg is above Vth_sp1. Optionally, the process can be adjusted so that Vsg is the same regardless of the initial read voltage and whether it is above or below Vth_sp1. For example, if steps 654-656 are followed, step 660 can be modified to Vsg=Vth_lt+offset+0.5×dVsg. If steps 657-659 are followed, step 660 can be modified to Vsg=Vth_lt+offset−0.5×dVsg.

Generally, the final value of Vth_lt in step 660 is a Vth metric of a lower tail of the SG Vth distribution.

The method of FIG. 6G involves performing a plurality of successive read operations for SG transistors of a plurality of NAND strings, wherein each read operation of the plurality of successive read operations uses a different read voltage and the read voltages are increased in each of the successive read operations; determining a count of the SG transistors having a Vth which is below the read voltage for each of the successive read operations; terminating the plurality of successive read operations when the count transitions from being below a specified maximum count to being above the specified maximum count, or from being above the specified maximum count to being below the specified maximum count; and setting a control gate voltage for performing an operation in the memory device, wherein the control gate voltage is proportional to a value of the read voltage after the terminating. Specifically, the transition can represent the flow from the decision step 653 being true to the decision step 659 being false, or the flow from the decision step 653 being false to the decision step 656 being true.

FIG. 6H is a flowchart of an example process for evaluating the Vth distribution of a set of SG transistors consistent with step 601 of FIG. 6A, where an upper tail of the Vth distribution is read using multiple read voltages in an iterative process and, in response, a SG control gate voltage is set for use during a program voltage of a programming operation. Thus, the precise position of the Vth upper tail is detected and used to adaptively set a SG control gate voltage for later use.

This approach provides an iterative way to evaluate the upper tail of the Vth distribution.

At step 670, the host device issues a program command and data for a block or sub-block. An initial value of Vth_ut is set at step 671. Step 672 involves reading the SG transistors at Vth_ut, and counting a number of the SG transistors with Vth>Vth_ut. A decision step 673 determines whether the count<bit ignore. Bit ignore is a maximum allowable number of SG transistors which are allowed to be out-of-range on the high side.

If decision step 673 is false, step 674 is followed. Step 674 sets Vth_ut=Vth_ut+dVsg, where dVsg is a positive voltage increment. Step 675 involves reading the SG transistors at Vth_ut, and counting a number of the SG transistors with Vth>Vth_ut. A decision step 676 determines whether the count<bit ignore. If decision step 676 is false, step 674 is repeated. If decision step 676 is true, step 680 is reached. Step 680 involves setting Vsg=Vth_ut+offset_ut, where offset_ut is a positive value which can be optimized for each memory device. Step 681 performs a programming operation which applies Vsg to the SG transistors during the program voltages.

If decision step 673 is true, step 677 is followed. Step 677 sets Vth_ut=Vth_ut−dVsg. Step 678 involves reading the SG transistors at Vth_ut, and counting a number of the SG transistors with Vth>Vth_ut. A decision step 679 determines whether the count<bit ignore. If decision step 679 is true, step 677 is repeated. If decision step 679 is false, step 680 is reached.

This process determines a specific read voltage which is close to, within a margin of no more than +/−dVsg, of a theoretical Vth (e.g., Vth_spu in FIG. 12C) above which exactly the bit ignore number of the SG transistors have a higher Vth. If the path of steps 677-679 is followed, the initial Vth_ut is above this specific read voltage and the read voltage is iteratively decreased until the read voltage is just below this specific read voltage. If the path of steps 674-676 is followed, the initial Vth_ut is below this specific read voltage and the read voltage is iterative increased until the read voltage is just above this specific read voltage.

For instance, referring to FIG. 12C, assume Vth_ut=Vth_ut4 in step 672. In this case, decision step 673 is true (since Vth_ut4>Vth_spu). Vth_ut=Vth_ut3 in step 677 (assuming dVsg is the increment between the voltages in FIG. 12C) so that decision step 679 is false (since Vth_ut3<Vth_spu). In this case, Vth_ut3 is the final voltage which is a Vth metric which represents the lower tail. At step 680, Vsg=Vth_ut3+offset_ut=Vsg2 as depicted in FIG. 12C.

In another example, assume Vth_ut=Vth_ut1 in step 672. In this case, decision step 673 is false (since Vth_ut1<Vth_spu). Vth_ut=Vth_ut2 in step 674, and decision step 676 is false (since Vth_ut2<Vth_spu). Vth_ut=Vth_ut3 in step 674, and decision step 676 is false (since Vth_ut3<Vth_spu). Finally, in a fourth iteration, Vth_ut=Vth_ut4 in step 674, and decision step 676 is true (since Vth_ut4>Vth_spu). In this case, Vth_ut4 is the final voltage which is a Vth metric which represents the lower tail. At step 680, Vsg=Vth_ut4+offset_ut. In this example, Vsg is higher by dVsg when the initial read voltage is below Vth_spu than when Vsg is above Vth_spu.

Optionally, the process can be adjusted so that Vsg is the same regardless of the initial read voltage and whether it is above or below Vth_spu. For example, if steps 674-676 are followed, step 680 can be modified to Vsg=Vth_ut+offset −0.5×dVsg. If steps 677-679 are followed, step 680 can be modified to Vsg=Vth_ut+offset+0.5×dVsg.

Generally, the final value of Vth_ut in step 680 is a Vth metric of an upper tail of the SG Vth distribution.

The method of FIG. 6H involves performing a plurality of successive read operations for SG transistors of a plurality of NAND strings, wherein each read operation of the plurality of successive read operations uses a different read voltage and the read voltages are incremented in each of the successive read operations; determining a count of the SG transistors having a Vth which exceeds the read voltage for each of the successive read operations; terminating the plurality of successive read operations when the count transitions from being below a specified maximum count to being above the specified maximum count, or from being above the specified maximum count to being below the specified maximum count; and setting a control gate voltage for performing an operation in the memory device, wherein the control gate voltage is proportional to a value of the read voltage after the terminating. Specifically, the transition can represent the flow from the decision step 673 being true to the decision step 679 being false, or the flow from the decision step 673 being false to the decision step 676 being true.

Figure 13A:
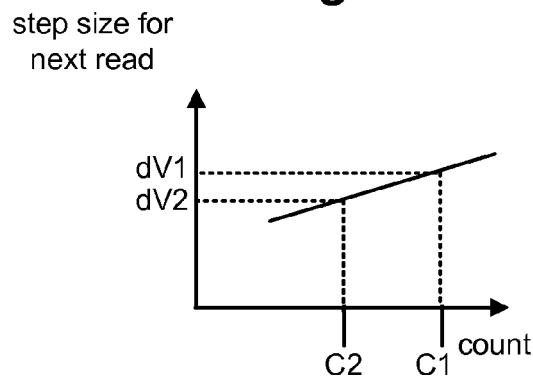
FIG. 13A depicts a plot of a step size for determining a read voltage in a current iteration of an iterative read operation such as discussed in FIGS. 6G and 6H, as a function of a count in a prior iteration.

Further, for at least one read operation of the plurality of successive read operations, the read voltage is increased by a relatively large amount when a value of the count in a prior read operation of the plurality of successive read operations is relatively large, e.g., according to FIG. 13A.

The control gate voltage for the SG transistors, such as during read and program-verify operations for memory cells can therefore be adjusted based on a Vth metric of the lower and/or upper tail. In one approach, the Vth metric of the upper tail may result in a more optimum control gate voltage since a smaller offset is used compared to the offset used for the Vth metric of the lower tail. The controller can store the optimal SG control gate voltage indexed to a specific block or sub-block. Different control gate voltages can be stored indexed to respective blocks or sub-blocks.

Moreover, the evaluation process may occur in response to an erase command where optimum control gate voltages can be determined similarly for the select transistors for use during erase and erase-verify operations of the memory cells.

Figure 7:
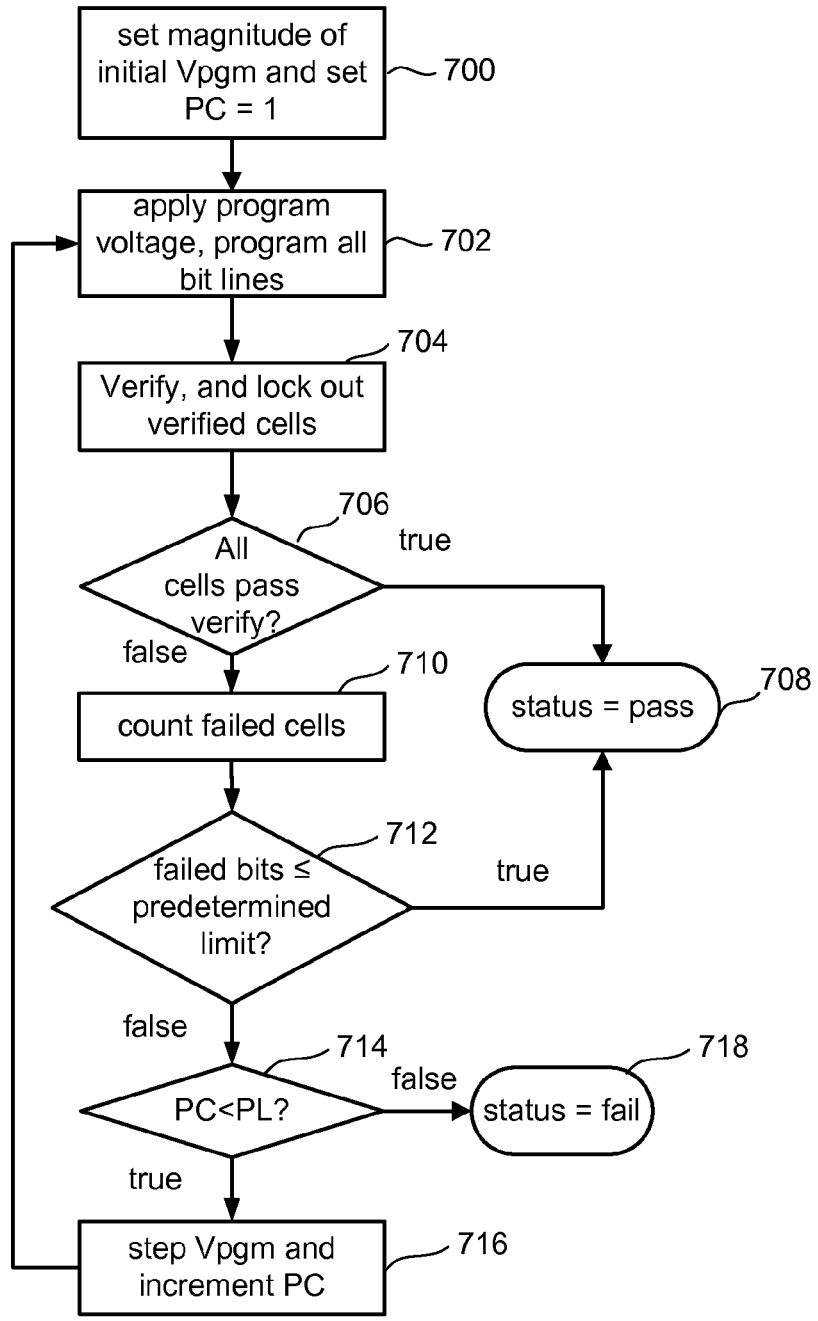
FIG. 7 is a flowchart describing an example process for performing a programming operation, consistent with steps 648, 661 and 681 of FIGS. 6F, 6G and 6H, respectively.

FIG. 7 is a flowchart describing an example process for performing a programming operation, consistent with steps 648, 661 and 681 of FIGS. 6F, 6G and 6H, respectively. The programming operation may program memory cells connected to a selected word line to one or more target data states.

In step 700, the programming voltage (Vpgm) is initialized to the starting magnitude (e.g., 12-16 V) and a program counter PC maintained by state machine 222 is initialized at 1. In step 702, a programming voltage is applied to the selected word line. The unselected word lines receive a pass voltage (e.g., 7-9 V) to perform channel boosting. If a memory cell should be programmed, the corresponding bit line is grounded. If the memory cell should remain at its current Vth, the corresponding bit line is connected to Vdd to inhibit programming.

In step 704, the appropriate memory cells are verified using the appropriate verify voltages. In one embodiment, the verification process is performed by testing whether the threshold voltages of the memory cells selected for programming have reached the appropriate verify voltage (e.g., Vv1, Vv2 and Vv3 in FIG. 9A).

A decision step 706 determines whether all the memory cells have reached their target threshold voltages and passed a verify test. If this decision step is true, the programming process is complete and successful because all selected memory cells were programmed and verified to their target states. A status=pass is reported in step 708. If decision step 706 is false, not all of the memory cells have reached their target threshold voltages (fail), the programming process continues to step 710.

In step 710, the system counts the number of memory cells that have not yet reached their respective target Vth distribution. That is, the system counts the number of cells that have failed the verify test.

In decision step 712, it is determined whether the count from step 710 is less than or equal to a predetermined limit. In one embodiment, the predetermined limit is the number of bits that can be corrected by ECC during a read process for the page of memory cells. If decision step 712 is true, the programming process can stop and a status=pass is reported in step 708. If decision step 712 is false, the program counter PC is checked against the program limit value (PL). If PC>=PL, at step 714,140 the program process is considered to have failed and a status=fail is reported in step 718. If PC<PL, the process continues at step 716, where Vpgm is stepped up and PC is incremented. After step 716, the process loops back to step 702 and another programming voltage is applied to the selected word line.

Figure 8:
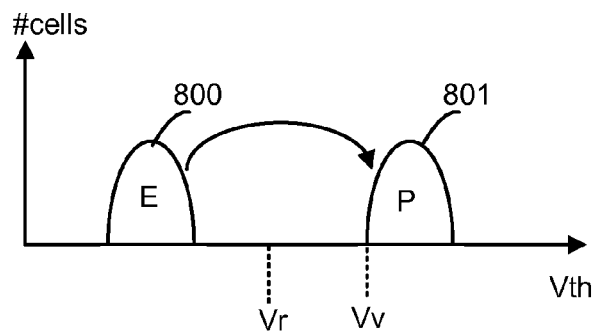
FIG. 8 illustrates example Vth distributions for a set of memory cells, where each memory cell stores one bit of data.

FIG. 8 illustrates example Vth distributions for a set of memory cells, where each memory cell stores one bit of data. The Vth distributions 800 and 801 correspond to two data states: state E for erased memory cells and state P for programmed memory cells. The figure also depicts a read reference voltage Vr and a verify voltage Vv. By testing whether the Vth of a given memory cell is above or below Vr, the system can determine whether the memory cell is erased (E) or programmed (P). When programming memory cells, the system will test whether those memory cells have a Vth greater than or equal to Vv.

Figure 9A:
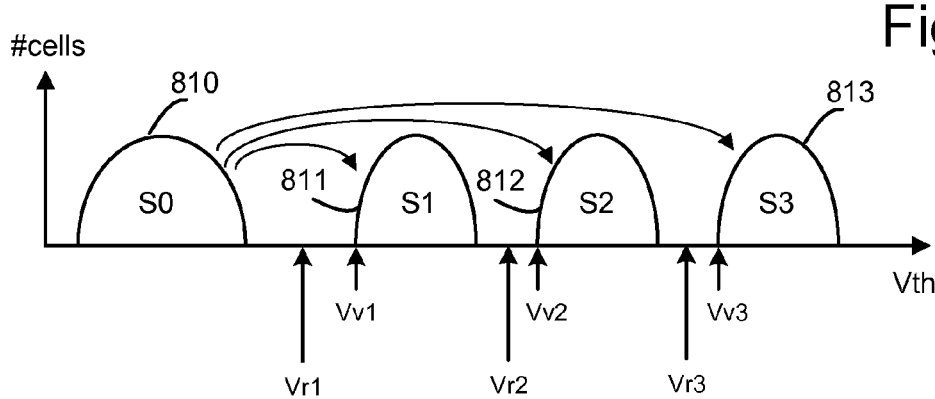
FIG. 9A illustrates example Vth distributions for a set of memory cells, where each memory cell stores two bits of data.
Figure 9B:
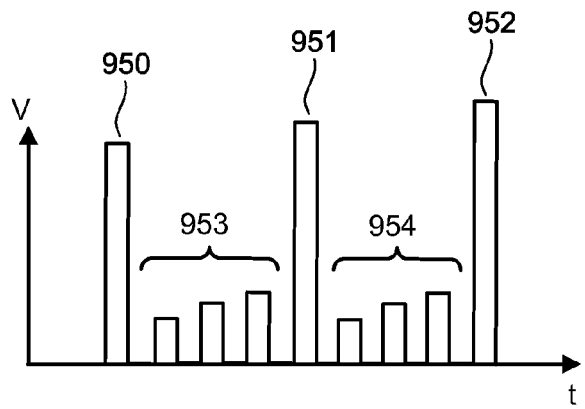
FIG. 9B illustrates example program voltage and verify voltages used in a programming operation, consistent with the four data states of FIG. 9A.

FIG. 9A illustrates example Vth distributions for a set of memory cells, where each memory cell stores two bits of data. The vertical axis depicts a number of cells and the horizontal axis depicts Vth. There are four Vth distributions 810, 811, 812 and 813 which represent data states S0, S1, S2 and S3, respectively (e.g., E, A, B and C, respectively). In one embodiment, S0 is for erased memory cells.

Each data state corresponds to a unique value for the two data bits stored in the memory cell. In some devices, the memory cells will be erased to state S0. From state S0, the memory cells can be programmed to any of states S1-S3. In one embodiment, the memory cells can be programmed from the erased state S0 directly to any of the target data states S1-S3. The verify voltages are Vv1, Vv2 and Vv3, respectively. These verify voltages are used as comparison levels during the programming process. For example, when programming memory cells to state S1, the system will check to see if the threshold voltages of the memory cells which have S1 as their target data state have reached Vv1. If the Vth of a memory cell has not reached Vv1, then programming will continue for that memory cell until its Vth is greater than or equal to Vv1. If the Vth of a memory cell has reached Vv1, then programming will stop for that memory cell. Verify voltages Vv2, Vv3 and Vv4 are used for memory cells being programmed to states S2, S3 and S4, respectively.

Read voltages Vr1, Vr2 and Vr3 are also depicted. By testing whether the memory cells are conductive when the read voltages are applied, the data states of the memory cells can be determined.

In general, during verify operations and read operations, the selected word line is connected to a demarcation voltage for each read operation or verify operation to determine whether a Vth of the memory cell has reached such level. While applying the word line voltage, the current of the NAND string of the memory cell is measured to determine whether the memory cell is in a conductive state. If the conduction current is greater than a certain value, the memory cell is in a conductive state and that the voltage applied to the word line is greater than the Vth of the memory cell. If the conduction current is not greater than the certain value, the memory cell is in a non-conductive state and the voltage applied to the word line is not greater than the Vth of the memory cell. During a read or verify process, the unselected memory cells are provided with one or more read pass voltages at their control gates so that these memory cells will operate as pass gates (e.g., conducting current regardless of whether they are programmed or erased).

FIG. 9B illustrates example program voltage and verify voltages used in a programming operation, consistent with the four data states of FIG. 9A. The vertical axis depicts voltage and the horizontal axis depicts time or program loop number. The figure depicts programming voltages 950, 951 and 952 with a set of verify voltages 953 or 954 between the programming voltages. When performing full sequence programming in one embodiment, the verification process between programming voltages will test for each of the data states S1-S3 using the verify voltages Vv1, Vv2 and Vv3, respectively. In some embodiments, different verify voltages can be used according to the program loop number.

FIG. 10A depicts example voltages for use when the operation of step 600 is an erase operation, where the erase operation uses gate-induced drain leakage (GIDL) to charge up the channel of a NAND string, such as in a 3D memory device. In FIG. 10A-10E, the vertical axis depicts voltage and the horizontal axis depicts time. The waveform 1000 depicts a series of bit line and/or source line voltages 1001, 1003 and 1005 with magnitudes of Verase1$a$, Verase2$a$ and Verase3$a$, respectively, which step up in each erase-verify iteration. The waveform also depicts SG voltages 1002, 1004 and 1006 with a common magnitude of Vsg_er, in one approach. This value can be optimized as discussed based on a Vth metric of the upper and/or lower tail of the SG Vth distribution.

In another approach, the SG voltage also steps up with the bit line and/or source line voltage. The waveform provides a number of erase-verify loops EV1$a$, EV2$a$ and EV3$a$, each of which includes an erase portion and a verify portion (verify test). The channel of a NAND string can be charged up in an erase operation based on GIDL, which is generated in proportion to the drain-to-gate voltage of the SG transistors at the drain-end and/or source-end of the NAND sting. In another option, the erase voltage steps up to its peak in two steps instead of one to allow time for the charge up of the channel to occur. In another option, the erase voltage and the SG voltage both step up to their peaks in two steps. This approach is particularly suitable for a 3D memory device.

FIG. 10B depicts an example channel voltage consistent with FIG. 10A. FIG. 10B is time-aligned with FIG. 10A. The channel voltage (Vch) in represented by a waveform 1010 which has elevated portions 1011, 1012 and 1013 coincident with the elevated voltages of FIG. 10A. In the approach of FIGS. 10A and 10B, the word line voltage is at a level, e.g., 0 V or close to 0 V, which provides a positive channel-to-gate voltage.

FIG. 10C depicts example voltages for use when the operation of step 600 is an erase operation, where a positive voltage is applied to a p-well of a substrate in a 2D memory device. This approach is particularly suitable for a 2D memory device. The waveform 1020 comprises voltage pulses 1021, 1022 and 1023 with amplitudes of Verase1$b$, Verase2$b$ and Verase3b, respectively, which can step up in each loop. The voltage pulses are in erase-verify loops EV1b, EV2b and EV3b. The word line voltage may be at a level, e.g., 0 V or close to 0 V, which provides a positive channel-to-gate voltage.

FIG. 10D depicts example voltages for use when the operation of step 600 is an erase operation, where a negative voltage is applied to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1030 depicts a series of negative control gate voltages 1031, 1032 and 1033 with magnitudes of Verase1c, Verase2c and Verase3c, respectively, in erase-verify loops EV1c, EV2c and EV3c, respectively.

FIG. 10E depicts example verify voltages in an erase operation consistent with FIG. 10A-10D. The waveform 1040 includes voltage pulses 1041a, 1042a or 1043a at VvEr2 which are applied to the remaining word lines and voltage pulses 1041b, 1042b or 1043b at VvEr1 which are applied to the first-programmed word line. The erase-verify voltages can be small positive values, 0 V, or negative values.

Figure 11:
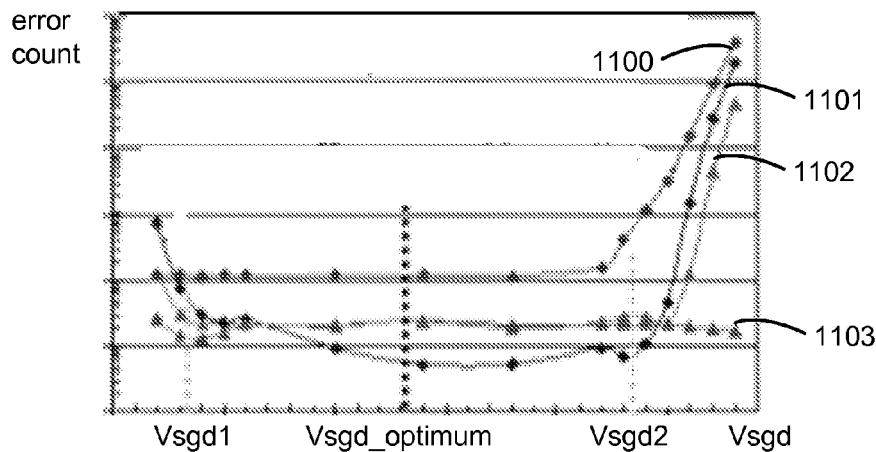
FIG. 11 depicts a plot of an error count as a function of, Vsgd, a control gate voltage of the drain-side select gate transistors, during the program voltages of a programming operation, for memory cells of different data states.

FIG. 11 depicts a plot of an error count as a function of, Vsgd, a control gate voltage of the drain-side SG transistors, during the program voltages of a programming operation, for memory cells of different data states. The plots 1100, 1101, 1102 and 1103 represent the error count for memory cells which were originally in data states E, A, B and C, respectively, before their Vth shifted to a point where the data state would be incorrectly read. Typically there is an upshift for the E, A and B state cells due to read disturb and a downshift for the C state cells due to data retention loss.

As mentioned, a single value of Vsgd is chosen which is suitable for both selected and unselected NAND string in a programming operation. The value should be optimized so that it is high enough to make the SGD transistors conductive in selected NAND strings but low enough to make the SGD transistors non-conductive in unselected NAND strings. Vsgd_optimum represents such an optimum value.

Moreover, Vsgd_optimum depends on the Vth of the SG transistors. Vsgd_optimum should be proportional to a Vth metric so that it is higher when the Vth metric is higher and lower when the Vth is lower. If the Vth changes while Vsgd remains the same, errors can result as indicated. In particular, there is a lower cliff at Vsgd1 where the error count increases sharply in plot 1101 for A state failures. These typically involve the Vth shifting higher so that the cell appears to be in the B state. At the lower cliff, the SGD transistor becomes non-conductive, resulting in an unintentional weak inhibit of a selected NAND string. Additional program loops may be needed to complete a programming operation, or the programming operation may fail. These additional program loops stress the unselected memory cells and can cause program disturb.

There is also an upper cliff at Vsgd2 where the error count increases sharply in plots 1100, 1101 and 1102 for E, A and B state failures. The highest error count is for E state cells which shift to the A state. Here, the SGD transistor becomes conductive in an unselected NAND string, resulting in a leakage of the channel boosting potential for the inhibited cells. This can also lead to an upshift in the Vth.

FIG. 12A depicts a plot of a SG Vth distribution, showing an initial distribution 1200, a distribution after read disturb 1201, and a distribution after data retention loss 1202. In FIG. 12A-12D, the vertical axis represents a count of SG transistors, on a log scale, and the horizontal axis represents Vth in Volts. Vsg_pgm_ver represents a verify voltage which may be used to program a SG transistor to the initial distribution, such as at the time of manufacture or during the lifetime of the memory device. Vsg_er_ver represents a verify voltage which may be used to erase a SG transistor to the initial distribution, such as at the time of manufacture or during the lifetime of the memory device. See step 605 of FIG. 6A. Subsequently, the Vth distribution can shift higher or lower, as discussed. The shape, including the width, of the distribution, can also change, but is typically Gaussian, having a pronounced peak with sloping sides, a lower tail 1205a with an endpoint 1205b, and an upper tail 1206a with an endpoint 1206b, as depicted in FIG. 12B. Vth_min and Vth_max define an acceptable range for the Vth distribution.

FIG. 12B depicts a plot of a SG Vth distribution which exceeds a maximum allowable voltage, Vth_max. The Vth distribution 1205 has a lower tail 1205a with an endpoint 1205b, and an upper tail 1206a with an endpoint 1206b. In this example, the endpoint Vth exceeds Vth_max and a region 1207 of the Vth distribution represents other SG transistors for which Vth>Vth_max.

FIG. 12C depicts a plot of a SG Vth distribution which is read using read voltages consistent with the processes of FIGS. 6G and 6H. The read voltages define equal voltage ranges of width dVsg, and the upper and lower tail endpoints are between maximum and minimum voltages. The Vth distribution 1210 has a lower tail 1210a with an endpoint 1210b, and an upper tail 1211a with an endpoint 1211b. The voltages for reading the lower tail are Vth_lt1, Vth_lt2 and Vth_lt3. The lower tail end point falls in a voltage range between Vth_lt2 and Vth_lt3. The voltages for reading the upper tail are Vth_ut1, Vth_ut2 and Vth_ut3. The upper tail end point falls in a voltage range between Vth_ut3 and Vth_ut4.

As discussed in connection with FIGS. 6G and 6H, Vth_sp1 is a theoretical value below which exactly the bit ignore number of the SG transistors have a lower Vth. Vth_spu is a theoretical value above which exactly the bit ignore number of the SG transistors have a higher Vth. A control gate voltage Vsg1 is obtained from Vth_lt1+offset_lt, and a control gate voltage Vsg2 is obtained from Vth_ut3+offset_ut as discussed previously.

An offset called offset a indicates how Vth_lt1 is obtained from Vth_ut4.

FIG. 12D depicts a plot of a select gate Vth distribution which is read using upper tail read voltages which are adaptively set, consistent with the processes of FIGS. 6G and 6H and with the plot of FIG. 13A. The Vth distribution 1215 has a lower tail 1215a with an endpoint 1215b, and an upper tail 1216a with an endpoint 1216b. The voltages for reading the upper tail are Vth_ut1, Vth_ut2a and Vth_ut3a. The upper tail end point falls in a voltage range between Vth_ut2a and Vth_ut3a. The read voltages are separated by increasingly smaller increments as depicted.

FIG. 13A depicts a plot of a step size for determining a read voltage in a current iteration of an iterative read operation such as discussed in FIGS. 6G and 6H, as a function of a count in a prior iteration. The step size for a given read iteration can be proportional to the count of SG transistors which have a Vth greater than the read level when reading the upper tail, or lower than the read level when reading the lower tail.

For the upper tail in FIG. 12C, assume Vth_ut1 in is the initial read level. The count of transistors with Vth>Vth_ut1 is C1, so the step size is dV1 and the next read voltage is Vth_ut2a=Vth_ut1+dV3. The count of transistors with Vth>Vth_ut2a is C2, so the step size is dV2 and the next read voltage is Vth_ut3a=Vth_ut3a+dV2. In this example, dV1>dV2.

Figure 13B:
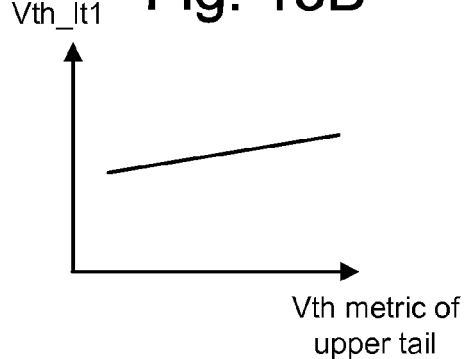
FIG. 13B depicts a plot of an initial read voltage, Vth_lt1, for reading a lower tail of a select gate Vth distribution in an iterative read operation such as discussed in FIG. 6G (step 651), as a function of a Vth metric of an upper tail of the select gate Vth distribution.

FIG. 13B depicts a plot of an initial read voltage, Vth_lt1, for reading a lower tail of a select gate Vth distribution in an iterative read operation such as discussed in FIG. 6G (step 651), as a function of a Vth metric of an upper tail of the select gate Vth distribution. If the upper tail is read before the lower tail, a Vth metric from reading the upper tail can be used to set Vth_lt1. For example, the Vth metric can be a final read voltage among multiple read voltages, e.g., Vth_ut4 in FIG. 12C. An offset can be subtracted from Vth_ut4 to arrive at Vth_lt1. See offset a in FIG. 12C.

This can help reduce the number of read operations for the lower tail since Vth_lt1 is adaptively set.

In another approach, the Vth metric can be a voltage in a range of voltages, such as a range of voltages in which the upper tail endpoint is located. For example, a midpoint in the voltage range could be used.

Figure 13C:
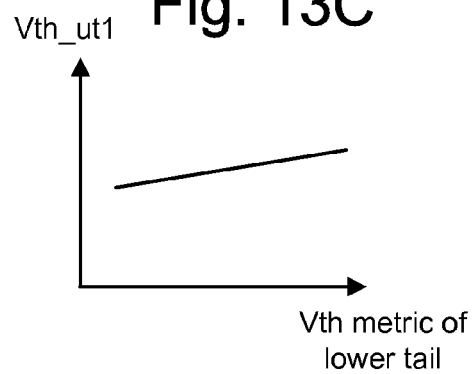
FIG. 13C depicts a plot of an initial read voltage, Vth_ut1, for reading an upper tail of a select gate Vth distribution in an iterative read operation such as discussed in FIG. 6H (step 671), as a function of a Vth metric of a lower tail of the select gate Vth distribution.

FIG. 13C depicts a plot of an initial read voltage, Vth_ut1, for reading an upper tail of a select gate Vth distribution in an iterative read operation such as discussed in FIG. 6H (step 671), as a function of a Vth metric of a lower tail of the select gate Vth distribution. If the lower tail is read before the upper tail, a Vth metric from reading the lower tail can be used to set Vth_ut1. For example, the Vth metric can be a final read voltage among multiple read voltages, e.g., Vth_lt3 in FIG. 12C. An offset can be added to Vth_lt3 to arrive at Vth_ut1. In another approach, the Vth metric can be a voltage in a range of voltages, such as a range of voltages in which the upper tail endpoint is located.

Figure 13D:
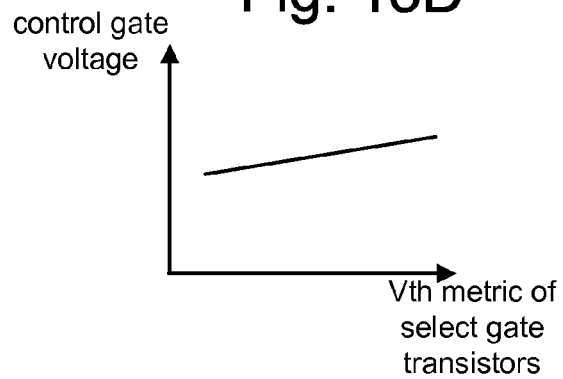
FIG. 13D depicts a plot of a control gate voltage of select gate transistors such as during a program voltage of a programming operation, as a function of a Vth metric of the select gate transistors.

FIG. 13D depicts a plot of a control gate voltage of select gate transistors such as during a program voltage of a programming operation, as a function of a Vth metric of the select gate transistors. Here, the Vth metric can be obtained from reading both the lower and upper tails. For example, the Vth metrics can be the final read voltages which are obtained using the iterative processes of FIGS. 6G and 6H. The final read voltages are Vth_lt in step 660 of FIG. 6G and Vth_ut in step 680 of FIG. 6H. An offset can be added to an average of these voltages to obtain a control gate voltage: Vsg=(Vth_lt+Vth_ut)/2+offset, where the offset can be optimized for each memory device.

FIG. 14 depicts example NAND strings in the sub-blocks SB0-SB3 of FIG. 4A. As a simplification, the block include one SGS layer, four word line layers and one SGD layer, in sequence starting from the bottom of the stack and moving upwards. SB0 comprises NAND strings NS0_SB0, . . . , NS23_SB0. SB1 comprises NAND strings NS0_SB1, . . . , NS23_SB1. SB2 comprises NAND strings NS0_SB2, . . . , NS23_SB2. SB3 comprises NAND strings NS0_SB3, . . . , NS23_SB3. An SGS layer includes SGS transistors 1400-1407. A WL0 layer includes memory cells 1410-1417. A WL1 layer includes memory cells 1420-1427. A WL2 layer includes memory cells 1430-1437. A WL3 layer includes memory cells 1440-1447. An SGD layer includes SGD transistors 1450-1457.

Accordingly, it can be seen that, in one embodiment, a method for operating a memory device comprises: receiving first instructions from a host device at a memory device, the first instructions comprise a program command, write data and a first address, the first address identifies memory cells in one plurality of NAND strings; and in response to the first instructions, evaluating a threshold voltage distribution of select gate transistors of the one plurality of NAND strings and determining, based on the evaluating, whether to execute the program command by programming the memory cells corresponding to the first address with the write data, or to return a program fail status to the host device without programming the memory cells corresponding to the first address with the write data.

In another embodiment, a memory device comprises: a plurality of NAND strings, each NAND string comprising a select gate transistor and memory cells, the select gate transistors having a threshold voltage distribution; and a control circuit. The control circuit is configured to: receive first instructions from a host device, the first instructions comprise a program command, write data and a first address, the first address identifies memory cells in one plurality of NAND strings; in response to the first instructions, read the select gate transistors using a plurality of read voltages; based on the read of the select gate transistors, obtain a threshold voltage metric of a first tail of the threshold voltage distribution; and based on the threshold voltage metric of the first tail, determine a control gate voltage to apply to the select gate transistors during program voltages of a programming operation in which the write data is programmed into the memory cells in response to the program command, wherein the control gate voltage is calculated as a function of the threshold voltage metric of the first tail and an offset.

In another embodiment, a method for operating a memory device comprises: performing a plurality of successive read operations for select gate transistors of a plurality of NAND strings, wherein each read operation of the plurality of successive read operations uses a different read voltage and the read voltages are incremented in each of the successive read operations; determining a count of the select gate transistors having a threshold voltage which exceeds the read voltage for each of the successive read operations; terminating the plurality of successive read operations when the count transitions from being below a specified maximum count to being above the specified maximum count, or from being above the specified maximum count to being below the specified maximum count; and setting a control gate voltage for performing an operation in the memory device, wherein the control gate voltage is proportional to a value of the read voltage after the terminating.

In another embodiment, a memory device comprises: a first plurality of NAND strings, each NAND string comprising a SG among a plurality of SG transistors and memory cells; and a control. The control is configured to: receive a command from a host device, the command comprise an identifier of an operation and a first address, the first address identifies memory cells in the first plurality of NAND strings which are to undergo the operation; and in response to the command, perform an evaluation of a threshold voltage distribution of the plurality of SG transistors and determine, based on the evaluation, whether to execute the command or to return a program fail status to the host device without executing the command.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating a memory device, comprising:
receiving first instructions from a host device at a memory device, the first instructions comprise a program command, write data and a first address, the first address identifies memory cells in one plurality of NAND strings;
in response to the first instructions, evaluating a threshold voltage distribution of select gate transistors of the one plurality of NAND strings to determine whether a number of the select gate transistors which have a threshold voltage outside a specified range is greater than a maximum allowable number comprising at least 1-5% of the select gate transistors;
if the number of the select gate transistors which have a threshold voltage outside the specified range is not greater than the maximum allowable number, executing the program command by programming the memory cells corresponding to the first address with the write data; and
if the number of the select gate transistors which have a threshold voltage outside the specified range is greater than the maximum allowable number, returning a program fail status to the host device without programming the memory cells corresponding to the first address with the write data.

2. The method of claim 1, further comprising:
if the program fail status is returned to the host device, storing data indicating that the one plurality of NAND strings is ineligible to store data, and copying previously-programmed data from the one plurality of NAND strings to another plurality of NAND strings which is not marked as being ineligible to store data.

3. The method of claim 1, further comprising:
increasing the maximum allowable number over a lifetime of the memory device.

4. The method of claim 1, wherein the evaluating the threshold voltage distribution comprises:
reading the select gate transistors using an upper read voltage;
based on the reading, obtaining a first count of the select gate transistors having a threshold voltage above the upper read voltage;
reading the select gate transistors using a lower read voltage; and
obtaining a second count of the select gate transistors having a threshold voltage below the lower read voltage.

5. The method of claim 1, wherein the evaluating the threshold voltage distribution comprises:
reading the select gate transistors using an upper read voltage;
based on the reading, obtaining a first count of the select gate transistors having a threshold voltage above the upper read voltage;
determining a number of program-erase cycles in the memory device;
if the number of program-erase cycles is more than a specified number, reading the select gate transistors using a lower read voltage and obtaining a second count of the select gate transistors having a threshold voltage below the lower read voltage; and
if the number of program-erase cycles is less than the specified number, omitting reading of the select gate transistors using the lower read voltage.

6. The method of claim 1, wherein the evaluating the threshold voltage distribution comprises:
reading a lower tail of the threshold voltage distribution of the select gate transistors using a first plurality of read voltages;
obtaining a threshold voltage metric of the lower tail based on the reading;
reading an upper tail of the threshold voltage distribution of the select gate transistors using a second plurality of read voltages;
obtaining a threshold voltage metric of the upper tail based on the reading of the upper tail; and
determining a control gate voltage to apply to the select gate transistors during program voltages of the programming by adding an offset to an average of the threshold voltage metric of the lower tail and the threshold voltage metric of the upper tail.

7. The method of claim 6, further comprising:
selecting an initial read voltage of the second plurality of read voltages by adding an offset to the threshold voltage metric of the lower tail.

8. The method of claim 6, further comprising:
selecting an initial read voltage of the first plurality of read voltages by subtracting an offset from the threshold voltage metric of the upper tail.

9. The method of claim 1, further comprising, if the program fail status is returned to the host device:
subsequently receiving second instructions from the host device at the memory device, the second instructions comprise another program command and a second address, the second address identifies memory cells in another plurality of NAND strings and
in response to the second instructions:
evaluating a threshold voltage distribution of select gate transistors of the another plurality of NAND strings; and
determining, based on the evaluating of the threshold voltage distribution of the select gate transistors of the another plurality of NAND strings, whether to execute the another program command by programming the memory cells corresponding to the second address with the write data, or to return a program fail status to the host device without programming the memory cells corresponding to the second address with the write data.

10. The method of claim 1, further comprising:
saving a result of the evaluating, the result indicates the program command is to be executed;
receiving second instructions from the host device at the memory device, the second instructions comprise a second program command, second write data and a second address, the second address identifies memory cells in the one plurality of NAND strings; and
in response to the result, executing the second program command by programming the memory cells corresponding to the second address with the second write data without evaluating the threshold voltage distribution of the select gate transistors.

11. The method of claim 1, wherein:
the select gate transistors are in a select gate layer; and
the select gate layer comprises a conductive layer in a stack of alternating conductive and dielectric layers.

12. The method of claim 1, further comprising:
setting a frequency for checking an upper tail of the threshold voltage distribution; and
setting a frequency for checking a lower tail of the threshold voltage distribution, wherein the frequency for checking the upper tail is greater than the frequency for checking the lower tail, wherein the evaluating the threshold voltage distribution comprises obtaining a count of the select gate transistors having a threshold voltage above an upper read voltage according to the frequency for checking the upper tail, and deciding whether to obtain a count of the select gate transistors having a threshold below a lower read voltage according to the frequency for checking the lower tail.

13. The method of claim 1, wherein:
the maximum allowable number is based on a number of errors in the memory cells which can be corrected using error correction code decoding.

14. A memory device, comprising:
a plurality of strings, each string comprising a select gate transistor and memory cells, wherein the select gate transistors are in a select gate layer; and
a control circuit, the control circuit is configured to:
  receive a program command from a host device;
  in response to the program command, identify out of range select gate transistors, wherein the out of range select gate transistors have an out of range threshold voltage;
  identify a number N1 of the out of range select gate transistors which are adjacent to another out of range select gate transistor;
  identify a number N2 of the out of range select gate transistors which are not adjacent to another out of range select gate transistor;
  determine a first score based on N1;
  determine a second score based on N2;
  determine a total score based on N1 and N2, wherein N1 is weighted more heavily than N2;
  compare the total score to a pass-fail score; and
  based on the compare of the total score to the pass-fail score, decide whether to execute the program command or return a program fail status to the host device.

15. The memory device of claim 14, wherein:
the select gate layer comprises a conductive layer in a stack of alternating conductive and dielectric layers.

16. The memory device of claim 14, wherein:
the strings comprise NAND strings.

17. A memory device, comprising:
a plurality of strings, each string comprising a select gate transistor and memory cells, wherein the select gate transistors are in a select gate layer; and
means for receiving a program command from a host device;
  means for, in response to the means for receiving, identifying out of range select gate transistors, wherein the out of range select gate transistors have an out of range threshold voltage;
  means for determining a total score which is based on a number of the out of range select gate transistors, wherein the total score is based on weights of the out of range select gate transistors, and the weights are based on locations of the out of range select gate transistors;
  means for comparing the total score to a pass-fail score; and
  means, based on the means for comparing, for deciding whether to execute the program command or return a program fail status to the host device.

18. The memory device of claim 17, wherein:
the out of range select gate transistors comprise out of range select gate transistors at an edge of the select gate layer and out of range select gate transistors not at the edge of the select gate layer; and
the means for determining the total score assigns higher weights to the out of range select gate transistors at the edge of the select gate layer than to the out of range select gate transistors not at the edge of the select gate layer.

19. The memory device of claim 17, wherein:
the select gate layer comprises a conductive layer in a stack of alternating conductive and dielectric layers.

20. The memory device of claim 17, wherein:
the strings comprise NAND strings.

* * * * *